(12) United States Patent
Sugitani et al.

(10) Patent No.: US 11,973,088 B2
(45) Date of Patent: Apr. 30, 2024

(54) DISPLAY DEVICE HAVING VARYING THICKNESS INSULATING LAYER

(71) Applicant: Samsung Display Co., Ltd., Yongin-Si (KR)

(72) Inventors: Koichi Sugitani, Suwon-si (KR); Hye In Kim, Hwaseong-si (KR); Gwui Hyun Park, Hwaseong-si (KR); Chul Won Park, Hwaseong-si (KR); Pil Soon Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 158 days.

(21) Appl. No.: 17/397,553

(22) Filed: Aug. 9, 2021

(65) Prior Publication Data
US 2022/0130868 A1    Apr. 28, 2022

(30) Foreign Application Priority Data
Oct. 22, 2020    (KR) ........................ 10-2020-0137244

(51) Int. Cl.
*H01L 27/12*    (2006.01)
*H10K 59/12*    (2023.01)
(Continued)

(52) U.S. Cl.
CPC ........ *H01L 27/1248* (2013.01); *H01L 27/124* (2013.01); *H01L 27/1288* (2013.01);
(Continued)

(58) Field of Classification Search
CPC ............. H01L 27/1248; H01L 27/1288; H01L 27/1259; H01L 27/124; H10K 59/124;
(Continued)

(56) References Cited

U.S. PATENT DOCUMENTS

2007/0210309 A1*  9/2007  Cho .................... H01L 27/1288
257/59
2015/0279866 A1* 10/2015  Zhang ................. H01L 27/1248
438/158

(Continued)

FOREIGN PATENT DOCUMENTS

KR    10-2013-0063872 A    6/2013
KR    10-2016-0002596 A    1/2016

*Primary Examiner* — Paisley L Wilson
(74) *Attorney, Agent, or Firm* — Innovation Counsel LLP

(57) ABSTRACT

A display device and a method of manufacturing a display device are provided. An embodiment of a display device includes a substrate; a first conductive layer disposed on the substrate; a first insulating layer disposed on the first conductive layer; a second conductive layer connected to the first conductive layer through a first contact hole in the first insulating layer; a second insulating layer filling an inside of the first contact hole; and a third insulating layer disposed on the second conductive layer and the second insulating layer. The first insulating layer includes a first region that overlaps the second conductive layer and a second region that does not overlap the second conductive layer, and a top surface of the first region of the first insulating layer is positioned higher than a top surface of the second region of the first insulating layer.

13 Claims, 20 Drawing Sheets

(51) Int. Cl.
*H10K 59/123* (2023.01)
*H10K 59/124* (2023.01)
*H10K 59/80* (2023.01)

(52) U.S. Cl.
CPC ....... *H10K 59/1201* (2023.02); *H10K 59/123* (2023.02); *H10K 59/124* (2023.02); *H10K 59/80516* (2023.02)

(58) Field of Classification Search
CPC ............ H10K 59/1201; H10K 59/123; H10K 59/80516
See application file for complete search history.

(56) References Cited

U.S. PATENT DOCUMENTS

| | | | |
|---|---|---|---|
| 2019/0198534 A1* | 6/2019 | Je ...................... | H01L 29/78675 |
| 2020/0168682 A1* | 5/2020 | Kishimoto .......... | H01L 27/1248 |
| 2020/0388661 A1* | 12/2020 | Kishimoto ......... | H10K 59/1213 |

* cited by examiner

120: 121a, 121b, 121c
130: 131
140: 141
150: 151, 152
160: 161a

120: 121a, 121b, 121c
130: 131
140: 141
150: 151, 152
160: 161a

120: 121a, 121b, 121c
130: 131
140: 141
150: 151, 152
160: 161

120: 121a, 121b, 121c
130: 131
140: 141
150: 151, 152
160: 161

DISPLAY DEVICE HAVING VARYING THICKNESS INSULATING LAYER

CROSS-REFERENCE TO RELATED APPLICATION

This application claims priority from Korean Patent Application No. 10-2020-0137244 filed on Oct. 22, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method of manufacturing the same.

2. Description of the Related Art

The importance of display devices has steadily increased with the development of multimedia technology. In response to the increasing importance, various types of display devices such as an organic light emitting display (OLED), a liquid crystal display (LCD) and the like have been used. Such display devices have been variously applied to various mobile electronic devices, for example, portable electronic devices such as a smart phone, a smart watch, and a tablet PC.

When manufacturing a display device, a plurality of conductive layer patterns may be formed through etching. When forming the plurality of conductive layer patterns, a photoresist may be used to mask the patterns. The photoresist that masks the conductive layer patterns may be removed through a later removal process.

SUMMARY

When patterning a conductive layer disposed between an upper organic layer and a lower organic layer, a connection electrode may be patterned without a separate masking pattern removal process by using the upper organic layer as a masking pattern. Accordingly, aspects of the present disclosure provide a display device with improved reliability by minimizing damage to a lower via layer.

Aspects of the present disclosure also provide a method of manufacturing a display device capable of improving process efficiency by omitting a masking pattern removal process.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

An embodiment of a display device includes a substrate, a first conductive layer, a first insulating layer, a second conductive layer, a first contact hole, a second insulating layer, and a third insulating layer. The first conductive layer is disposed on the substrate. The first insulating layer is disposed on the first conductive layer. The second conductive layer is connected to the first conductive layer through the first contact hole in the first insulating layer. The second insulating layer fills an inside of the first contact hole. The third insulating layer is disposed on the second conductive layer and the second insulating layer. The first insulating layer includes a first region that overlaps the second conductive layer and a second region that does not overlap the second conductive layer, and a top surface of the first region of the first insulating layer is positioned higher than a top surface of the second region of the first insulating layer.

An embodiment of a method of manufacturing a display device includes disposing a first insulating layer on a substrate. A conductive material is disposed on the first insulating layer. A second insulating layer is disposed on the conductive material. A masking pattern is formed by exposing and developing the second insulating layer. The conductive layer is etched to form a conductive pattern. The masking pattern is etched back. A third insulating layer is disposed on the conductive pattern and the masking pattern.

In the display device according to one embodiment, when patterning a conductive layer disposed between the upper and lower organic layers, the connection electrode may be patterned using the upper organic layer as a masking pattern without a separate masking pattern removal process. Accordingly, it is possible to improve reliability of the display device by minimizing damage to a lower via layer. In addition, process efficiency can be improved by omitting the masking pattern removal process.

It should be noted that the above and other effects of the present disclosure will be apparent from the following description.

BRIEF DESCRIPTION OF THE DRAWINGS

The above and other aspects and features of the present disclosure will become more apparent by describing in detail embodiments of the above and other aspects and features of the present disclosure with reference to the attached drawings.

DETAILED DESCRIPTION OF THE EMBODIMENTS

The inventive concept will now be described more fully hereinafter with reference to the accompanying drawings, in which embodiments are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented. e.g., rotated 90 degrees or at other orientations, and the spatially relative descriptors used herein interpreted accordingly.

The same reference numbers indicate the same components throughout the specification.

Hereinafter, embodiments will be described in detail with reference to the accompanying drawings.

Figure 1:
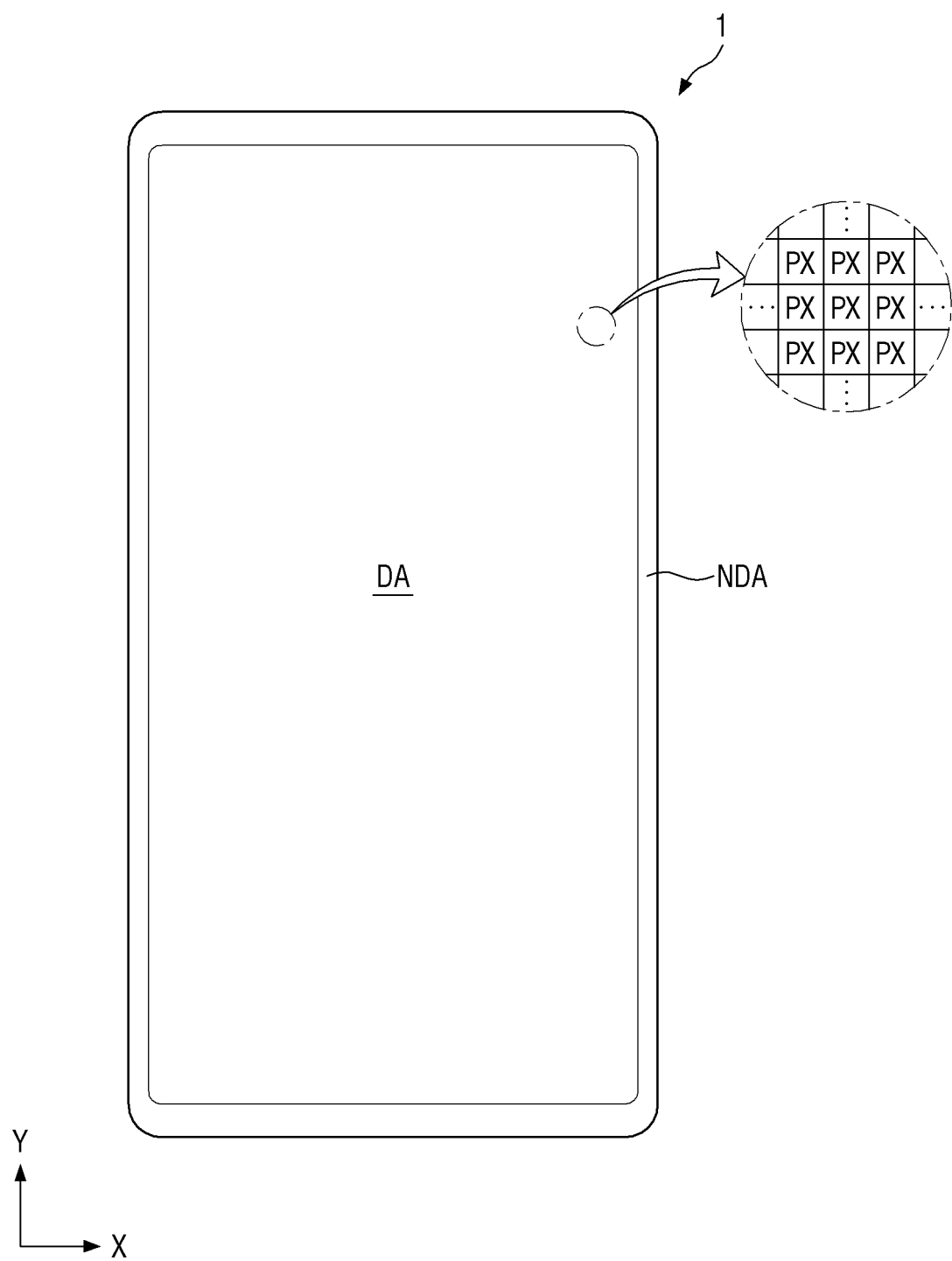
FIG. 1 is a plan view of a display device according to one embodiment.

FIG. 1 is a plan view of a display device 1 according to one embodiment.

Referring to FIG. 1, the display device 1 displays a moving image or a still image. The display device 1 may refer to any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 includes a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified. However, in embodiments, other display panels may be applied within the same scope of the technical spirit.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DA of the display device 1 may also be similar to the overall shape of the display device 1. In FIG. 1, the display device 1 and the display area DA having a rectangular shape elongated in the horizontal direction are illustrated.

The display device 1 may include the display area DA and a non-display area NDA. The display area DA is an area where a screen can be displayed, and the non-display area NDA is an area where a screen is not displayed. The display area DA may also be referred to as an active region, and the non-display area NDA may also be referred to as a non-active region. The display area DA may substantially occupy the center of the display device 1.

The display area DA may include a plurality of pixels PX. The plurality of pixels PX may be arranged in a matrix. The shape of each pixel PX may be a rectangular or square shape in plan view. However, in an embodiment, the shape of each pixel PX may be a rhombic shape in which each side is inclined with respect to one direction. The pixels PX may be alternately disposed in a stripe type or a pentile type.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may form a bezel of the display device 1. Wirings or circuit drivers included in the display device 1 may be disposed in the non-display area NDA, or external devices may be mounted on the non-display area NDA.

Figure 2:
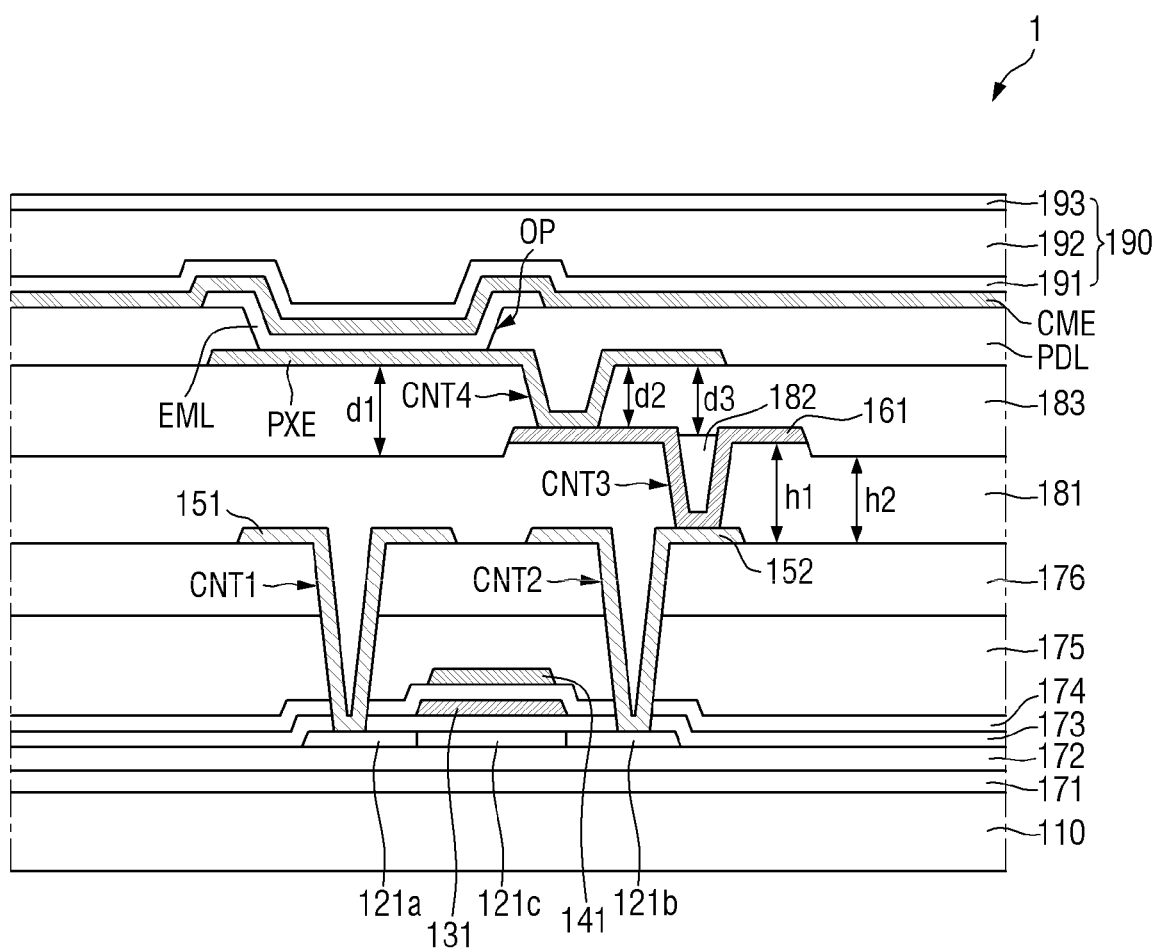
FIG. 2 is a cross-sectional view illustrating one pixel of a display device according to one embodiment.

FIG. 2 is a cross-sectional view illustrating one pixel of the display device 1 according to one embodiment.

Referring to FIG. 2, the display device 1 may include a base substrate 110, a barrier layer 171, a buffer layer 172, a semiconductor layer 120, a first gate insulating layer 173, a first conductive layer 130, a second gate insulating layer 174, a second conductive layer 140, a first interlayer insulating layer 175, a second interlayer insulating layer 176, a third conductive layer 150, a first via layer 181, a fourth conductive layer 160, a second via layer 182, a third via layer 183, a pixel electrode PXE, a pixel defining layer PDL, a light emitting layer EML, a common electrode CME, and a thin film encapsulation layer 190, which are sequentially disposed. Each of the layers described above may consist of a single layer, or a stack of multiple layers. Other layers may be further disposed between the layers.

The base substrate 110 supports the respective layers disposed on the base substrate 110. The base substrate 110 may be made of, for example, an insulating material such as a polymer resin. In an embodiment, the base substrate 110 may include a metal material.

The base substrate 110 may be a flexible substrate which can be bent, folded or rolled. An example of the material of the flexible substrate may be polyimide (PI).

A transparent substrate may be used as the base substrate 110 when the organic light emitting display device is a bottom emission type or a double-sided emission type. When the organic light emitting display device is a top emission type, in addition to a transparent substrate, a translucent or opaque substrate as the base substrate 110 may be applied.

The barrier layer 171 may be disposed on the base substrate 110. The barrier layer 171 may prevent diffusion of impurity ions, prevent permeation of moisture or external air, and perform a surface planarization function. The barrier layer 171 may include silicon nitride, silicon oxide, silicon oxynitride, or the like. The barrier layer 171 may be omitted depending on the type of the base substrate 110, process conditions, and the like.

The buffer layer 172 may be disposed on the barrier layer 171. The buffer layer 172 may include at least one of silicon nitride, silicon oxide, or silicon oxynitride. The buffer layer 172 may be omitted depending on the type of the base substrate 110, process conditions, and the like.

The semiconductor layer 120 may be disposed on the buffer layer 172. The semiconductor layer 120 may include a semiconductor pattern 121a, 121b, and 121c.

The semiconductor pattern 121a, 121b, and 121c may include a channel region 121c disposed to overlap in a thickness direction a first gate electrode 131 provided above the channel region 121c, and a first source/drain region 121a and a second source/drain region 121b disposed on one side and the other side of the channel region 121c, respectively. The first and second source/drain regions 121a and 121b may include a plurality of carrier ions and may have a high conductivity and low electric resistance in comparison with the channel region 121c.

The semiconductor layer 120 may be made of polycrystalline silicon, monocrystalline silicon, amorphous silicon, or the like. In the case where the semiconductor layer 120 is made of polycrystalline silicon, the polycrystalline silicon may be formed by crystallizing amorphous silicon using a crystallization method such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

The first gate insulating layer 173 may be disposed on the semiconductor layer 120. The first gate insulating layer 173 may cover not only the top surface of the semiconductor pattern 121a, 121b, and 121c excluding portions in which first and second contact holes CNT1 and CNT2 are formed, but also the side surface of the semiconductor pattern 121a, 121b, and 121c. The first gate insulating layer 173 may be disposed generally over the entire surface of the base substrate 110.

The first gate insulating layer 173 may include a silicon compound, a metal oxide, or the like. For example, the first gate insulating layer 173 may include silicon oxide, silicon nitride, silicon oxynitride, aluminum oxide, tantalum oxide, hafnium oxide, zirconium oxide, titanium oxide, or the like. These may be used alone or in combination with each other.

The first conductive layer 130 may be disposed on the first gate insulating layer 173. The first conductive layer 130 is a gate conductive layer and may include the first gate electrode 131. The first gate electrode 131 may form a capacitor together with a second gate electrode 141 to be described later. For example, the integrated first gate electrode 131 may overlap the semiconductor pattern 121a, 121b, and 121c to function as a gate electrode at the corresponding portion, and another part may overlap the second gate electrode 141 disposed above the integrated first gate electrode 131 to function as a first electrode of the capacitor.

The first conductive layer 130 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The second gate insulating layer 174 may be disposed on the first conductive layer 130. The second gate insulating layer 174 may cover the side surface of the first gate electrode 131 as well as the top surface of the first gate electrode 131 with the exception of the part where the contact holes CNT1 and CNT2 are formed. The second gate insulating layer 174 may be disposed generally over the entire surface of the first gate insulating layer 173.

The second gate insulating layer 174 may include a silicon compound, a metal oxide, or the like. For example, the second gate insulating layer 174 may include silicon oxide, silicon nitride, silicon oxynitride, aluminum oxide, tantalum oxide, hafnium oxide, zirconium oxide, titanium oxide, or the like. These may be used alone or in combination with each other.

The second conductive layer 140 may be disposed on the second gate insulating layer 174. The second conductive layer 140 is a capacitor conductive layer and may include the second gate electrode 141. The second gate electrode 141 may face the first gate electrode 131 disposed below the second gate electrode 141 with the second gate insulating layer 174 interposed between them, and may form the capacitor together with the first gate electrode 131.

The second conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The first and second interlayer insulating layers 175 and 176 may be sequentially disposed on the second conductive layer 140. The first interlayer insulating layer 175 may include a silicon compound, a metal oxide, or the like. For example, the first interlayer insulating layer 175 may include silicon oxide, silicon nitride, silicon oxynitride, aluminum oxide, tantalum oxide, hafnium oxide, zirconium oxide, titanium oxide, or the like. These may be used alone or in combination with each other.

The third conductive layer 150 may be disposed on the second interlayer insulating layer 176. The third conductive layer 150 is a data conductive layer and may include a data line (not shown) for applying a data signal. The third conductive layer 150 may include a first source/drain electrode 151 and a second source/drain electrode 152 of a transistor.

The first source/drain electrode 151 may be connected to the first source/drain region 121a of the semiconductor pattern 121a, 121b, and 121c through the first contact hole CNT1 that passes through the first and second interlayer insulating layers 175 and 176, the second gate insulating layer 174, and the first gate insulating layer 173 and exposes the first source/drain region 121a of the semiconductor pattern 121a, 121b, and 121c.

The second source/drain electrode 152 may be connected to the second source/drain region 121b of the semiconductor pattern 121a, 121b, and 121c through the second contact hole CNT2 that passes through the first and second interlayer insulating layers 175 and 176, the second gate insulating layer 174, and the first gate insulating layer 173 and exposes the second source/drain region 121b of the semiconductor pattern 121a, 121b, and 121c.

The third conductive layer 150 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The first via layer 181 (or planarization layer) may be disposed on the third conductive layer 150.

The first via layer 181 may be disposed on the third conductive layer 150 and may completely cover the top surface of the second interlayer insulating layer 176. In the case where the first via layer 181 is formed as an organic layer, the top surface of the first via layer 181 may be partially flat in spite of the step of the lower part of the first via layer 181. In addition, the first via layer 181 may allow most light to pass through the first via layer 181. That is, the first via layer 181 may include a light transmissive planarization layer.

The top surface of the first via layer 181 may include a step. In the first via layer 181, the step may be formed on the top surface between a region that overlaps a connection electrode 161 to be described later and a region that does not overlap the connection electrode 161. Specifically, on the top surface of the first via layer 181, the region that does not overlap the connection electrode 161 may have a shape that is recessed downward compared to the region that overlaps the connection electrode 161. In the first via layer 181, the top surface of the region that overlaps the connection electrode 161 may be positioned higher than the top surface of the region that does not overlap the connection electrode 161.

The first via layer 181 may have a different thickness for each region. Specifically, in the first via layer 181, a thickness h1 of the region that overlaps the connection electrode 161 may be greater than a thickness h2 of the region that does not overlap the connection electrode 161. Here, the thicknesses h1 and h2 of the first via layer 181 may mean an average thickness of each region. Specifically, in the first via layer 181, the thickness h1 of the region that overlaps the connection electrode 161 may mean an average thickness of the region that overlaps the connection electrode 161, and the thickness h2 of the region that does not overlap the connection electrode 161 may mean an average thickness of the region that does not overlap the connection electrode 161.

As will be described later, the region in the first via layer 181 that does not overlap the connection electrode 161 may be additionally etched through an etch-back process. On the other hand, the region in the first via layer 181 that overlaps the connection electrode 161 is covered with the connection electrode 161, so that the top surface of the region may not be etched even though the etch-back process is performed. Accordingly, in the first via layer 181, the average roughness of the region that does not overlap the connection electrode 161 may be greater than the average roughness of the region that overlaps the connection electrode 161.

The first via layer 181 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). For example, the first via layer 181 may be made of at least one of polyimide, methacrylate polymer, or siloxane polymer. In particular, when excellent transmittance is required, the first via layer 181 may be made of the siloxane polymer.

The fourth conductive layer 160 may be disposed on the first via layer 181. The fourth conductive layer 160 may include the connection electrode 161. The connection electrode 161 may be disposed on a region of the first via layer 181 of which the top surface protrudes upward. The connection electrode 161 may be connected to the second source/drain electrode 152 through a third contact hole CNT3 that passes through the first via layer 181 and extends to and exposes the second source/drain electrode 152.

The fourth conductive layer 160 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

In the first via layer 181 excluding a region where the third contact hole CNT3 is disposed, the top surface of the region that does not overlap the connection electrode 161 may be recessed more downward than the top surface of the region that overlaps the connection electrode 161. Therefore, as described above, in the first via layer 181, the thickness h1 of the region that overlaps the connection electrode 161 to be described later may be greater than the thickness h2 of the region that does not overlap the connection electrode 161.

The second via layer 182 may be disposed on the connection electrode 161. The second via layer 182 may fill the inside of the third contact hole CNT3. The second via layer 182 may partially fill the third contact hole CNT3. The top surface of the second via layer 182 may be positioned lower than the top surface of the connection electrode 161 disposed in a region that does not overlap the third contact hole CNT3. The top surface of the second via layer 182 may be positioned higher than the top surface of the first via layer 181. In the present disclosure, the position of the top surface of a specific component may mean a distance from the base substrate 110 to the corresponding top surface in a direction perpendicular to the top surface of the base substrate 110.

The second via layer 182 may be disposed separately from the first via layer 181 without contacting the first via layer 181, with the connection electrode 161 interposed between the second via layer 182 and the first via layer 181. The third via layer 183 to be described later may be disposed on the second via layer 182 while being in direct contact with the second via layer 182. The second via layer 182 may be disposed separately from the second source/drain electrode 152 with the connection electrode 161 interposed between the second via layer 182 and the second source/drain electrode 152.

Although it will be described later in the description of a manufacturing process of the display device, the second via layer 182 may be formed by etching back a masking pattern 182b (see FIG. 6) serving as a mask when patterning the connection electrode 161. When patterning the connection electrode 161 through the masking pattern 182b (see FIG. 6), the connection electrode 161 may be patterned without a separate stripping process, so that damage occurring in the first via layer 181, such as expansion of the first via layer 181, may be minimized. A more detailed description will be given later.

The average roughness of the top surface of the second via layer 182 may be smaller than the average roughness of the region in the first via layer 181 that does not overlap the connection electrode 161, and may be substantially the same as the average roughness of the region in the first via layer 181 that overlaps the connection electrode 161.

The second via layer 182 may include the organic insulating material described above in the first via layer 181. For example, the second via layer 182 may be made of at least one of polyimide, methacrylate polymer, or siloxane polymer. In particular, when excellent transmittance is required, the second via layer 182 may be made of the siloxane polymer. The second via layer 182 may be made of the same material as the first via layer 181.

The third via layer 183 may be disposed on the fourth conductive layer 160. The third via layer 183 may cover the first via layer 181, the second via layer 182, and the connection electrode 161.

In the third via layer 183, a thickness d1 of a region that does not overlap the connection electrode 161 may be greater than thicknesses d2 and d3 of a region that overlaps the connection electrode 161. In the region of the third via layer 183 that overlaps the connection electrode 161, the thickness d3 of a region that overlaps the second via layer 182 may be greater than the thickness d2 of a region that does not overlap the second via layer 182. Here, the thickness d1, d2, d3 of each region in the third via layer 183 may mean an average thickness of each region. Specifically, the thickness d1 of the region in the third via layer 183 that does not overlap the connection electrode 161, and in the region of the third via layer 183 that overlaps the connection electrode 161, the thickness d2 of the region that does not overlap the second via layer 182 and the thickness d3 of the region that overlaps the second via layer 182 may each be the average thickness of the corresponding region. The top surface of the third via layer 183 may be substantially flat.

The third via layer 183 may include the organic insulating material described above in the first via layer 181. For example, the third via layer 183 may be made of at least one of polyimide, methacrylate polymer, or siloxane polymer. In particular, when excellent transmittance is required, the third via layer 183 may be made of the siloxane polymer. The third via layer 183 may be made of the same material as the first via layer 181 and the second via layer 182.

The pixel electrode PXE may be disposed on the third via layer 183. The pixel electrode PXE may be an anode electrode. The pixel electrode PXE may be separately disposed for each pixel. The pixel electrode PXE may penetrate the third via layer 183 and may be electrically connected to the connection electrode 161 through a fourth contact hole CNT4 exposing a part of the connection electrode 161.

The pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The layer having a high work function may be disposed above the reflective material layer and disposed closer to the light emitting layer EML. The pixel electrode PXE may have a stacked structure of ITO/Mg, ITO/MgF, ITO/Ag or ITO/Ag/ITO.

The pixel defining layer PDL may be disposed on the pixel electrode PXE. The pixel defining layer PDL may include an opening OP that partially exposes the pixel electrode PXE. The pixel defining layer PDL may partially cover the pixel electrode PXE and the third via layer 183.

The pixel defining layer PDL may be formed of an organic insulating material or an inorganic insulating material. For example, the pixel defining layer PDL may include at least one of polyimide resin, acrylic resin, a silicon compound, or polyacrylic resin.

The light emitting layer EML may be disposed on the pixel electrode PXE exposed by the pixel defining layer PDL. The light emitting layer EML may be disposed in the opening OP of the pixel defining layer PDL, and may partially cover the top surface of the pixel defining layer PDL and the side surface of the pixel defining layer PDL forming the opening OP.

The light emitting layer EML may include an organic material layer. The organic material layer may include an organic light emitting layer, and may further include a hole injection/transport layer and an electron injection/transport layer.

The common electrode CME may be disposed on the light emitting layer EML. The common electrode CME may be extended across all the pixels PX. The common electrode CME may be a cathode electrode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof, e.g., a mixture of Ag and Mg. The common electrode CME may further include a transparent metal oxide layer disposed on the material layer having a low work function.

The pixel electrode PXE, the light emitting layer EML, and the common electrode CME may constitute an organic light emitting element.

The thin film encapsulation layer 190 may be disposed on the common electrode CME. The thin film encapsulation layer 190 may include a first inorganic layer 191, a first organic layer 192 disposed on the first inorganic layer 191, and a second inorganic layer 193 disposed on the first organic layer 192. Although not shown, the first inorganic layer 191 and the second inorganic layer 193 may be in contact with each other at the end of the thin film encapsulation layer 190, so that the first organic layer 192 may be sealed by the first inorganic layer 191 and the second inorganic layer 193.

Each of the first inorganic layer 191 and the second inorganic layer 193 may include silicon nitride, silicon oxide, silicon oxynitride, or the like. The first organic layer 192 may include an organic insulating material.

The display device 1 according to one embodiment may include the second via layer 182 to improve the reliability of the display device 1. As described above, the second via layer 182 is a result of a process, and may be formed by etching back a second via insulator 182c (see FIG. 7) formed through an etching process of the masking pattern 182b (see FIG. 6) serving as a mask when patterning the connection electrode 161. The improvement of the reliability of the display device 1 due to the second via layer 182 will be described in detail later with reference to FIGS. 3 to 9.

FIGS. 3 to 9 are cross-sectional views illustrating a part of a process for manufacturing the display device 1 of FIG. 2. Specifically, FIGS. 3 to 9 are cross-sectional views illustrating a manufacturing process from the formation of the third conductive layer 150 to the formation of the pixel electrode PXE.

Figure 3:
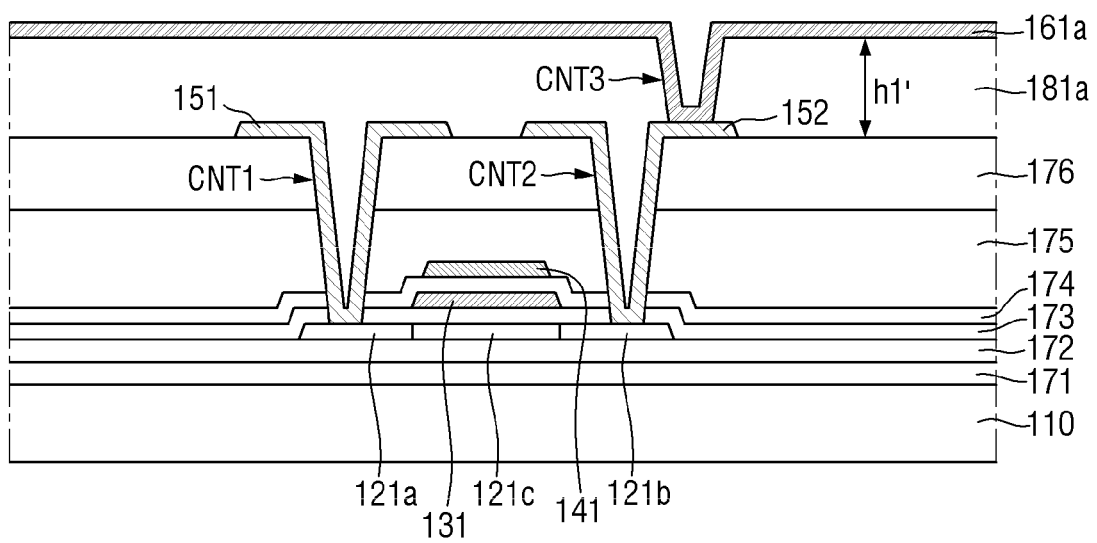
FIGS. 3, 4, 5, 6, 7, 8, and 9 are cross-sectional views illustrating a part of a process for manufacturing the display device of FIG. 2.

First, referring to FIG. 3, the base substrate 110 on which the barrier layer 171, the buffer layer 172, the semiconductor layer 120, the first gate insulating layer 173, the first conductive layer 130, the second gate insulating layer 174, the second conductive layer 140, the first interlayer insulating layer 175, the second interlayer insulating layer 176, and the third conductive layer 150 are disposed is prepared. A first via insulator 181a including the third contact hole CNT3 is formed on the third conductive layer 150, and a fourth conductive material 161a is formed on the first via insulator 181a.

The first via insulator 181a may be disposed to cover the third conductive layer 150 and the second interlayer insulating layer 176, but to expose a part of the top surface of the second source/drain electrode 152 through the third contact hole CNT3. That is, the first via insulator 181a may be substantially entirely formed above the base substrate 110 and may include the third contact hole CNT3 partially exposing the second source/drain electrode 152. A thickness h1' of a region in the first via insulator 181a that does not overlap the third conductive layer 150 may be substantially the same as the thickness h1 of the region in the first via layer 181 that overlaps the connection electrode 161 described above with reference to FIG. 2.

The fourth conductive material 161a may be formed entirely above the base substrate 110. The fourth conductive material 161a may form the connection electrode 161, described above with reference to FIG. 2, through a later patterning process.

Figure 4:
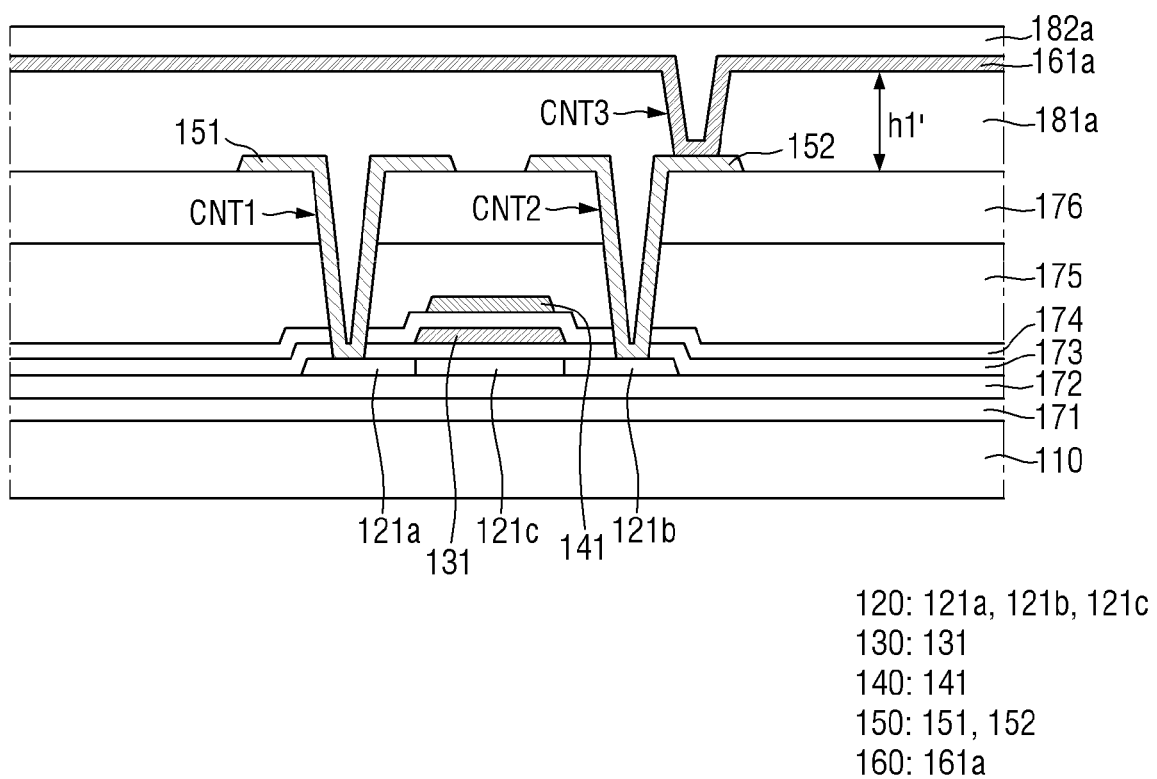

Next, referring to FIG. 4, a second via insulator layer 182a is formed on the fourth conductive material 161a. The second via insulator layer 182a may be entirely disposed on the fourth conductive material 161a. The second via insulator layer 182a may be disposed to fill a region depressed by the third contact hole CNT3, i.e., the inside of the third contact hole CNT3. The top surface of the second via insulator layer 182a may be substantially flat.

Figure 5:
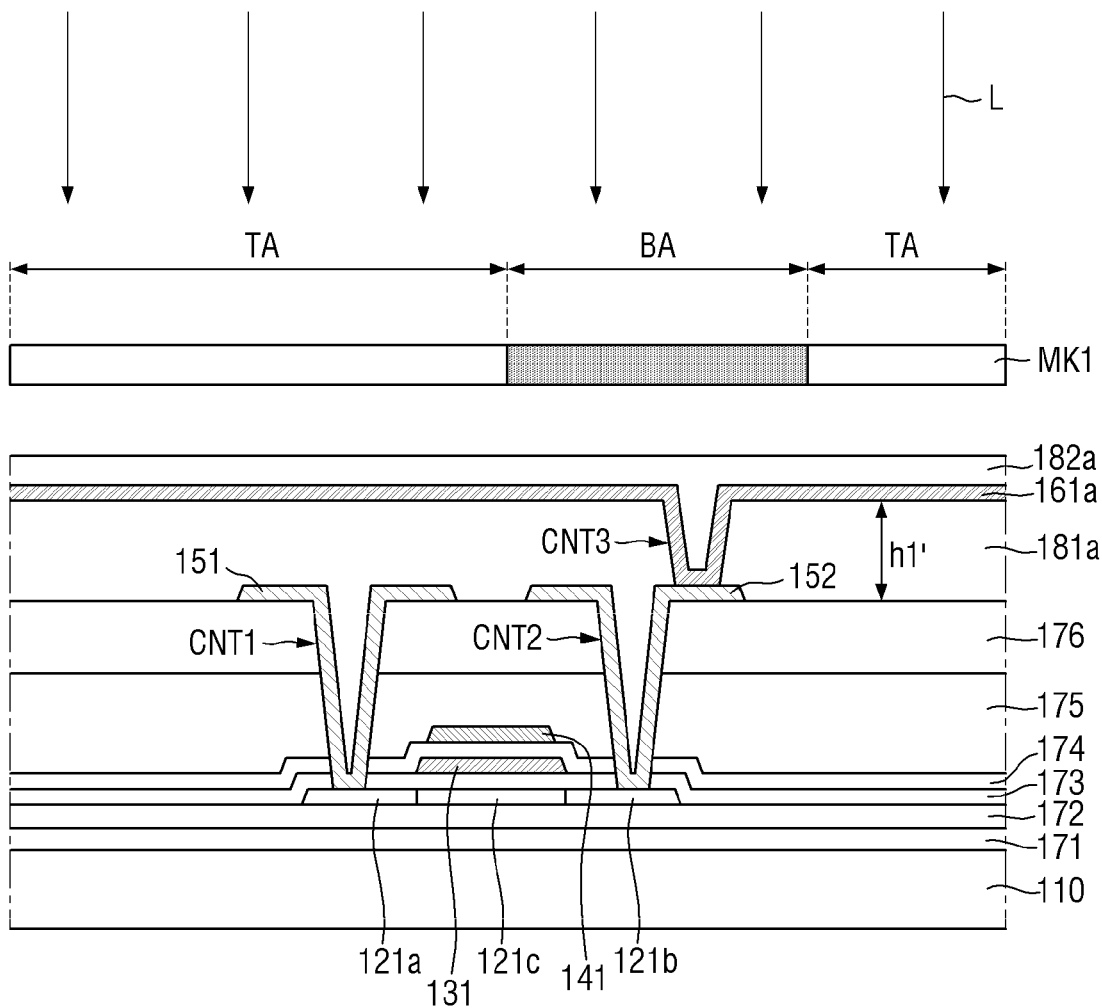
Figure 6:
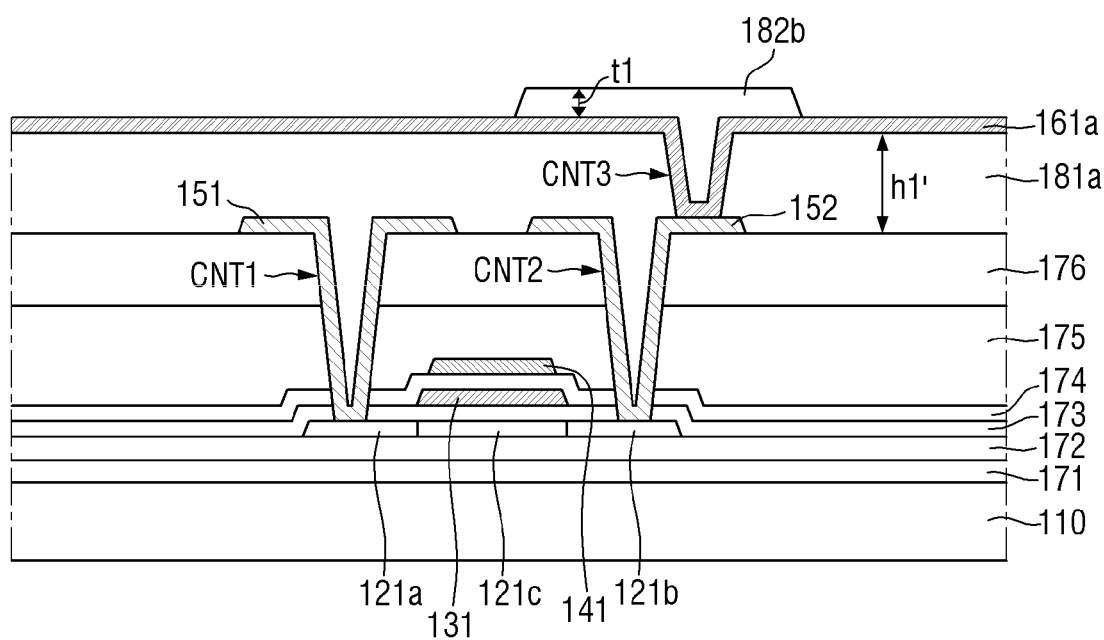

Next, referring to FIGS. 5 and 6, a first mask MK1 including a light transmitting area TA and a light blocking area BA is provided above the second via insulator layer 182a and then exposed to light L and developed to form the masking pattern 182b. Specifically, the first mask MK1 is disposed above the second via insulator layer 182a such that the light blocking area BA is positioned above the region where the connection electrode 161 of FIG. 2 is disposed, and the first mask MK1 is exposed and developed. Through this process, in the second via insulator layer 182a, a region overlapping the light transmitting area TA of the first mask MK1 may be removed and a region overlapping the light blocking area BA may remain to complete the masking pattern 182b having a first thickness t1 and covering the region where the connection electrode 161 is to be disposed.

Figure 7:
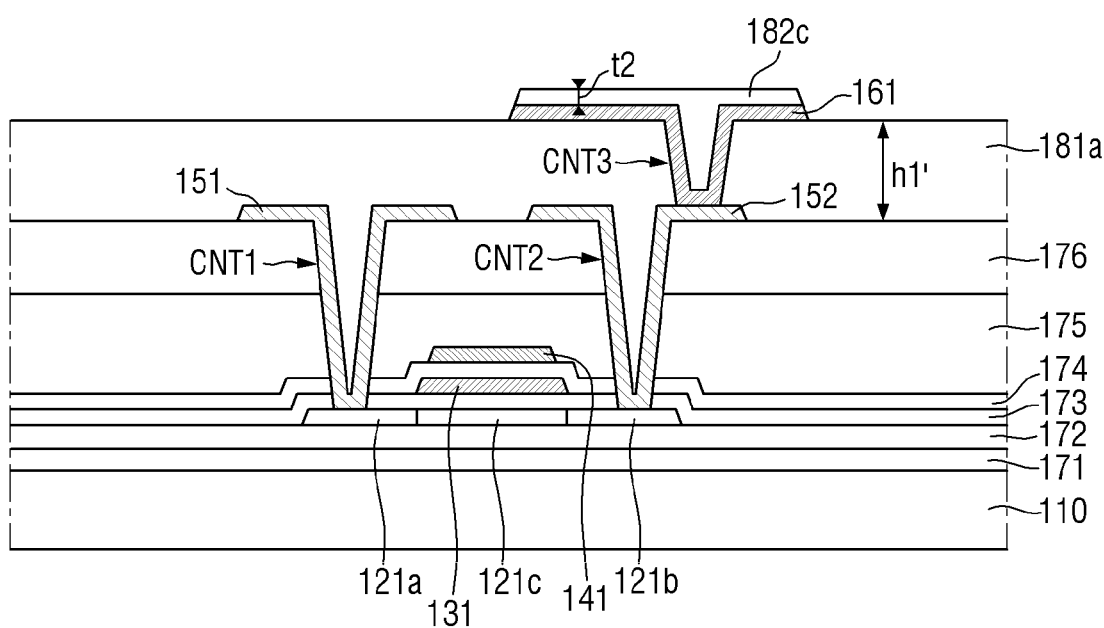

Then, referring to FIG. 7, the connection electrode 161 is formed by etching the fourth conductive material 161a by using the masking pattern 182b as an etching mask.

Meanwhile, in the etching process of forming the connection electrode 161, the thickness of the masking pattern 182b may also be partially reduced. As a result, the second via insulator 182c having a second thickness t2 may be formed. The second via insulator 182c may be formed by partially etching the top surface of the masking pattern 182b. The second via insulator 182c may entirely cover the top surface of the connection electrode 161, but may not cover the side surface of the connection electrode 161.

Figure 8:
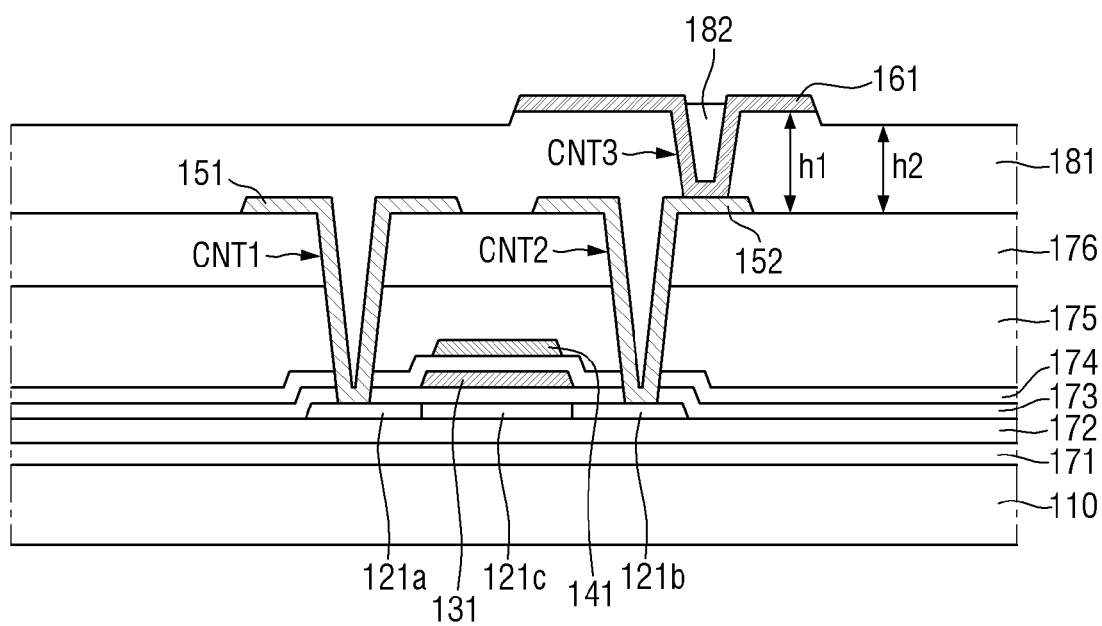

Thereafter, as shown in FIG. 8, an etch-back process is performed to remove the second via insulator 182c (see FIG. 7) on the top surface of the connection electrode 161 and expose the top surface of the connection electrode 161. The etch-back process is performed using an etchant having a high etching rate for the second via insulator 182c. The etchant used in the etch-back process may include, for example, carbon tetrafluoride and oxygen.

As a result of the etch-back process, the second via insulator 182c on the connection electrode 161 may all be removed except for a region where the third contact hole CNT3 is disposed, but the second via insulator 182c inside the contact hole may remain to form the second via layer 182. The second via insulator 182c may be sufficiently etched back to completely expose the top surface of the connection electrode 161. The second via insulator 182c inside the third contact hole CNT3 may be exposed to the etchant of the etch-back for an additional predetermined time even after the top surface of the connection electrode 161 is exposed. Accordingly, the top surface of the second via layer 182 completed by the etch-back process may be depressed to be at a lower height than the top surface of the connection electrode 161.

The second via layer 182 inside the third contact hole CNT3 derived from the masking pattern 182b may remain without being removed even after the etch-back process. As described above, since the second via layer 182 includes any one of polyimide, methacrylate polymer, or siloxane polymer having high heat resistance, even if the second via layer 182 remains in the structure, a phenomenon in which the second via layer 182 is deformed by heat to affect the display device 1 may not occur. Accordingly, a process of stripping the mask pattern may be omitted. A stripper, which is usually used in the process of stripping the mask pattern, may cause damage such as swelling the first via layer 181, and as described above, if the stripping process for the second via layer 182 applied to the mask pattern is omitted, the above damage may be fundamentally prevented.

Meanwhile, although the etch-back process is a process for etching the second via insulator 182c, since the first via insulator 181a is also made of the same or similar material as the second via insulator 182c, the first via insulator 181a having the same or similar etching selectivity may be etched together through the etch-back process, so that the thickness of the first via insulator 181a may be reduced. Accordingly, the first via layer 181 having a stepped top surface may be completed.

Figure 9:
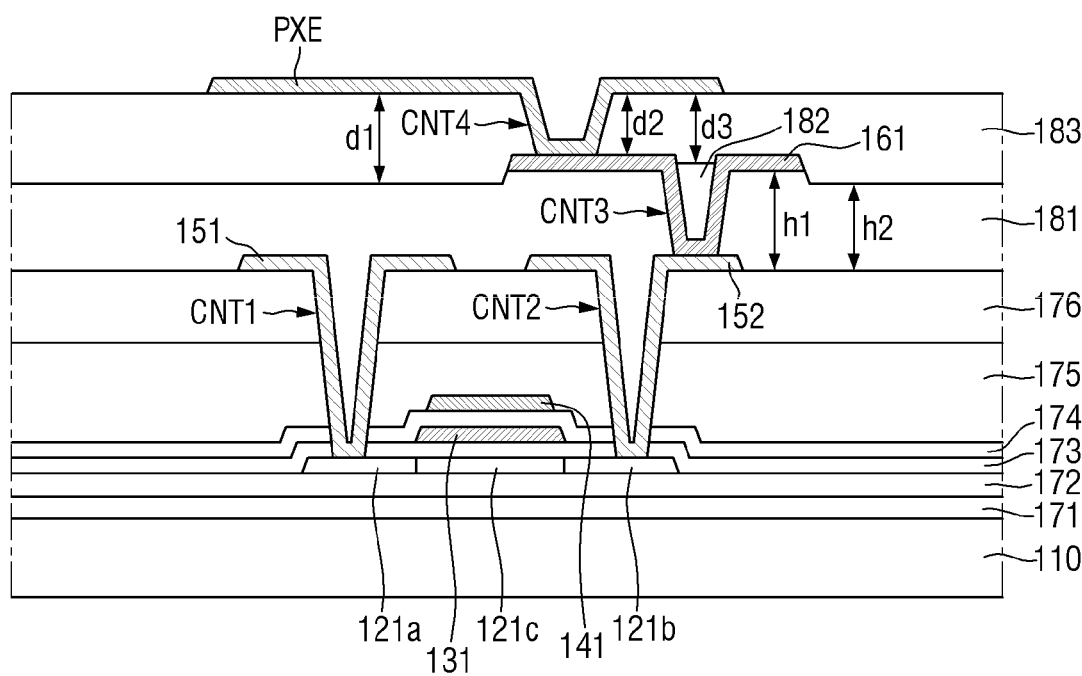

Next, referring to FIG. 9, the third via layer 183 is formed on the first via layer 181, the second via layer 182, and the connection electrode 161. Specifically, a material for the third via layer 183 is entirely coated on the structure of FIG. 8 and then exposed and developed to complete the third via layer 183 including the fourth contact hole CNT4. Since the third via layer 183 is formed on the second via layer 182 filling the third contact hole CNT3, the flatness of the third via layer 183 may be improved in a region overlapping the third contact hole CNT3.

Subsequently, a material for the pixel electrode PXE is deposited on the third via layer 183 and patterned to form the pixel electrode PXE. The pixel electrode PXE may be disposed to contact the connection electrode 161 through the fourth contact hole CNT4.

Although not shown, the light emitting layer EML, the common electrode CME, and the thin film encapsulation layer 190 are formed in a subsequent process, so that the display device 1 according to one embodiment described above with reference to FIG. 2 may be manufactured.

Hereinafter, an embodiment of the display device 1 will be described. In the following description of the display device 1 according to an embodiment, redundant parts of the description of the display device 1 according to one embodiment will be omitted, and differences will be mainly described.

Figure 10:
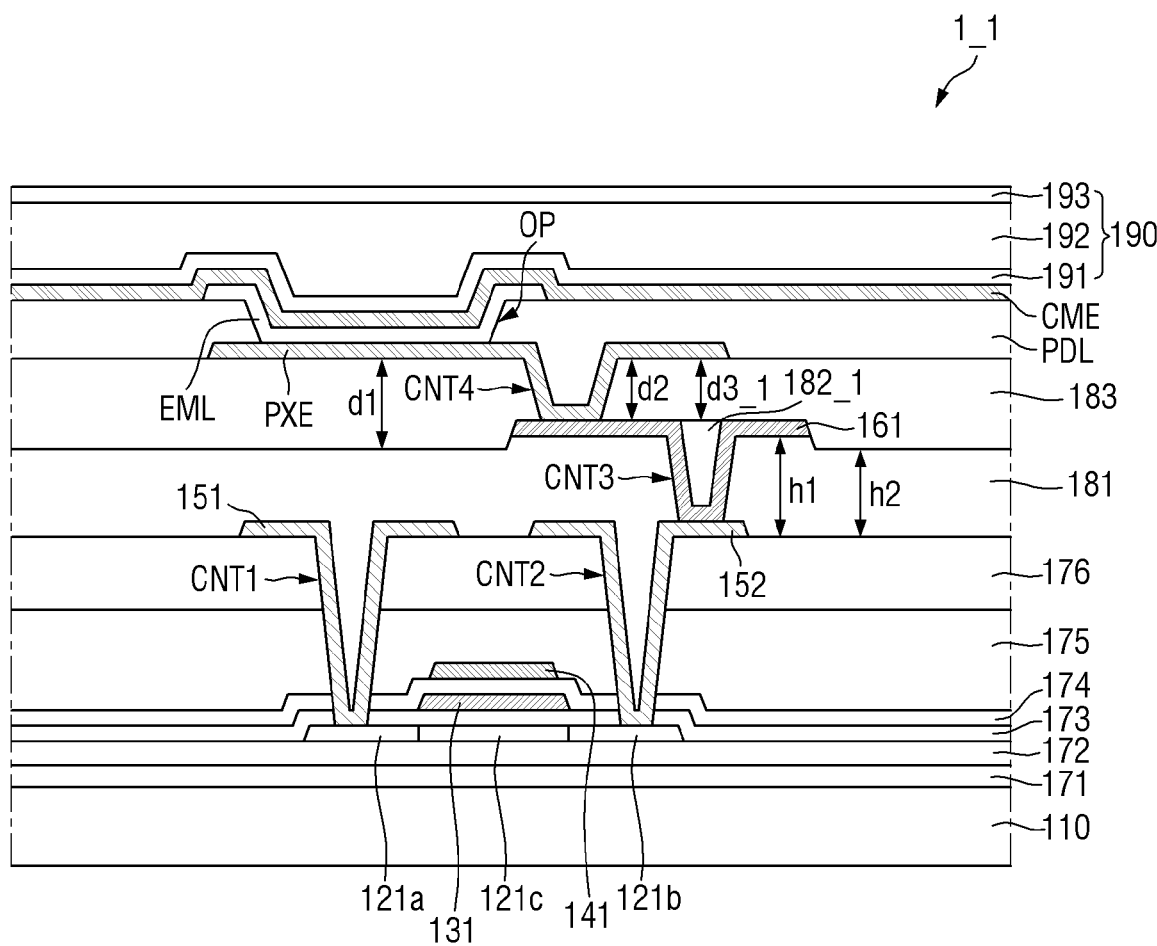
FIG. 10 is a cross-sectional view illustrating one pixel of a display device according to an embodiment.

FIG. 10 is a cross-sectional view illustrating one pixel of a display device 1_1 according to an embodiment.

Referring to FIG. 10, the display device 1_1 according to the present embodiment is different from the display device 1 according to one embodiment, e.g., see FIG. 2, in that the top surface of a second via layer 182_1 is positioned at the same height as the top surface of the connection electrode 161.

In the present embodiment, the second via layer 182_1 may be disposed on the connection electrode 161. The second via layer 182_1 may fill the inside of the third contact hole CNT3. The second via layer 182_1 may completely fill the third contact hole CNT3. As described above, the top surface of the second via layer 182_1 may be positioned at the same height as the top surface of the connection electrode 161 disposed in a region that does not overlap the third contact hole CNT3, and may be aligned with the top surface of the connection electrode 161.

The top surface of the second via layer 182_1 may be positioned higher than the top surface of the first via layer 181. Specifically, the top surface of the second via layer 182_1 may be positioned higher than the top surface of the first via layer 181 that overlaps the connection electrode 161, and the top surface of the first via layer 181 that does not overlap the connection electrode 161.

In the third via layer 183, the thickness d1 of the region that does not overlap the connection electrode 161 may be greater than thicknesses d2 and d3_1 of the region that overlaps the connection electrode 161. In the region of the third via layer 183 that overlaps the connection electrode 161, the thickness d3_1 of a region that overlaps the second via layer 182 may be substantially the same as the thickness d2 of a region that does not overlap the second via layer 182.

The display device 1_1 according to the present embodiment may include the second via layer 182_1 to improve the reliability of the display device 1. The second via layer 182_1 is a result of a process, and may be formed by etching back the second via insulator 182c (see FIG. 7) formed through etching of the masking pattern 182b (see FIG. 6) serving as a mask when patterning the connection electrode 161. When patterning the connection electrode 161 through the masking pattern 182b (see FIG. 6) which is in the form before being etched into the second via layer 182_1, the connection electrode 161 may be patterned without a separate stripping process, so that damage occurring in the first via layer 181, such as expansion of the first via layer 181, may be minimized, thus improving the reliability of the display device 1.

Figure 11:
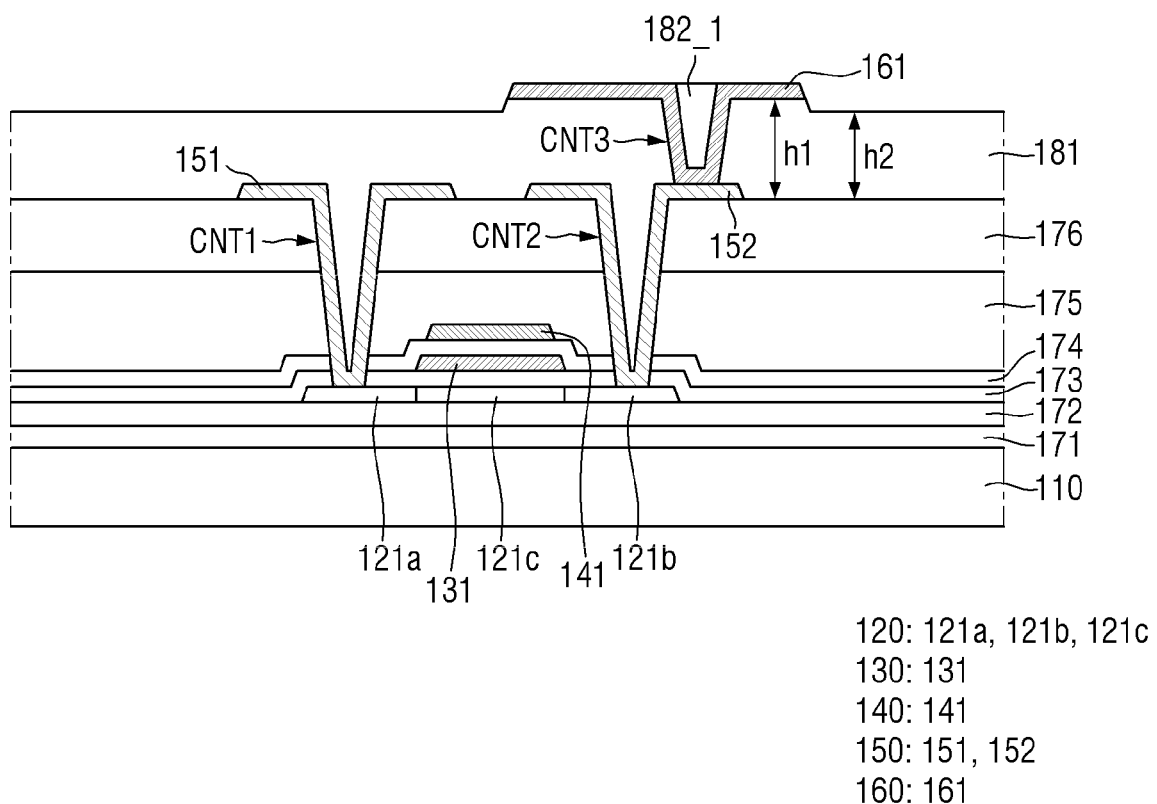
FIGS. 11 and 12 are cross-sectional views illustrating a part of a process for manufacturing the display device of FIG. 10.
Figure 12:
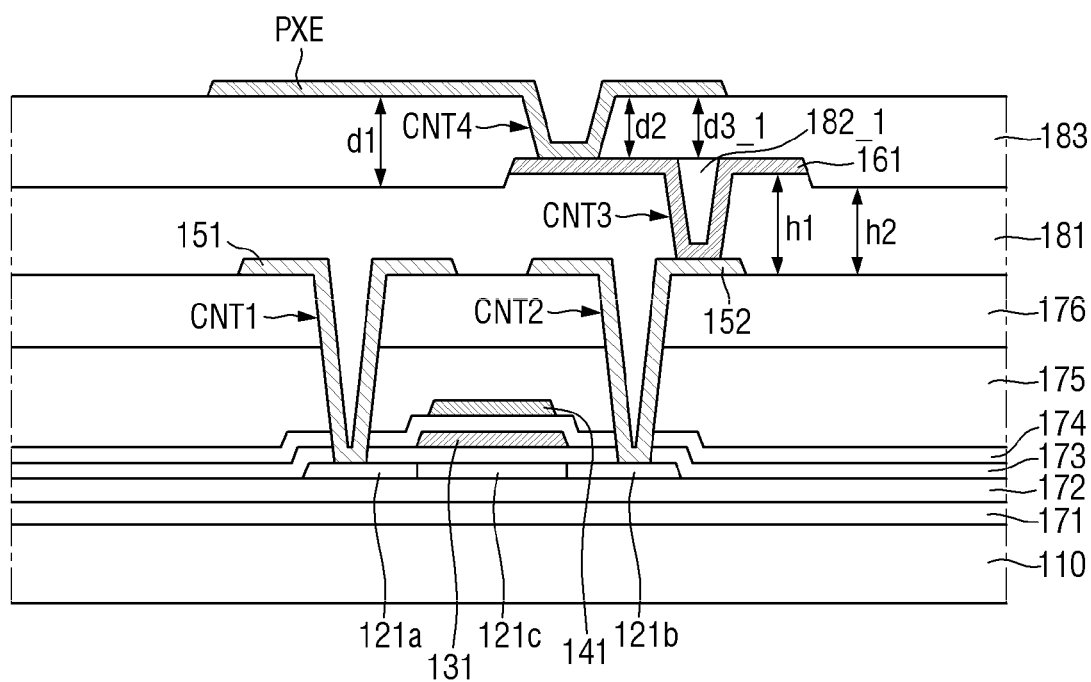

FIGS. 11 and 12 are cross-sectional views illustrating a part of a process for manufacturing the display device of FIG. 10. The manufacturing process of the display device according to the present embodiment is mostly the same as the manufacturing process of the display device described above with reference to FIGS. 3 to 9, but has a difference in that a process with reference to FIGS. 11 and 12 is performed instead of the process with reference to FIGS. 8 and 9. That is, FIGS. 11 and 12 are views showing a manufacturing process after passing through the processes of FIGS. 3 to 7.

Referring to FIG. 11 in conjunction with FIGS. 3 to 7, an etch-back process is performed to remove the second via insulator 182c on the top surface of the connection electrode 161 and expose the top surface of the connection electrode 161. The etch-back process is as described above with reference to FIG. 8.

As a result of the etch-back process, the second via insulator 182c on the connection electrode 161 may all be removed except for a region where the third contact hole CNT3 is disposed, but the second via insulator 182c inside the contact hole may remain to form the second via layer 182_1. The second via insulator 182c may be sufficiently etched back to completely expose the top surface of the connection electrode 161. The second via insulator 182c inside the third contact hole CNT3 may be exposed to the etchant until the top surface of the connection electrode 161 is exposed. Accordingly, the top surface of the second via layer 182_1 completed by the etch-back process may be aligned to be at the same height as the top surface of the connection electrode 161.

The second via layer 182_1 may fill the inside of the third contact hole CNT3. As described above, the top surface of the second via layer 182_1 may be positioned at substantially the same height as the top surface of the connection electrode 161 disposed in a region that does not overlap the third contact hole CNT3. The top surface of the second via layer 182_1 may be positioned higher than the top surface of the first via layer 181.

The second via layer 182_1 inside the third contact hole CNT3 derived from the masking pattern 182b may remain without being removed even after the etch-back process. As described above, since the second via layer 182_1 includes any one of polyimide, methacrylate polymer, or siloxane polymer having high heat resistance, even if the second via layer 182_1 remains in the structure, a phenomenon in which the second via layer 182_1 is deformed by heat to affect the display device 1_1 may not occur. Accordingly, a process of stripping the mask pattern may be omitted. A stripper, which is usually used in the process of stripping the mask pattern, may cause damage such as swelling the first via layer 181, and as described above, if the stripping process for the second via layer 182_1 applied to the mask pattern is omitted, the above damage may be fundamentally prevented.

Meanwhile, although the etch-back process is a process for etching the second via insulator 182c, since the first via insulator 181a is also made of the same or similar material as the second via insulator 182c, the first via insulator 181a having the same or similar etching selectivity may be etched together through the etch-back process, so that the thickness of the first via insulator 181a may be reduced. Accordingly, the first via layer 181 having a stepped top surface may be completed.

Next, referring to FIG. 12, the third via layer 183 is formed on the first via layer 181, the second via layer 182_1, and the connection electrode 161. Specifically, a material for the third via layer 183 is entirely coated on the structure of FIG. 11 and then exposed and developed to complete the third via layer 183 including the fourth contact hole CNT4.

Subsequently, a material for the pixel electrode PXE is deposited on the third via layer 183 and patterned to form the pixel electrode PXE. The pixel electrode PXE may be disposed to contact the connection electrode 161 through the fourth contact hole CNT4.

Although not shown, the light emitting layer EML, the common electrode CME, and the thin film encapsulation layer 190 are formed in a subsequent process, so that the display device 1_1 according to one embodiment described above with reference to FIG. 10 may be manufactured.

Figure 13:
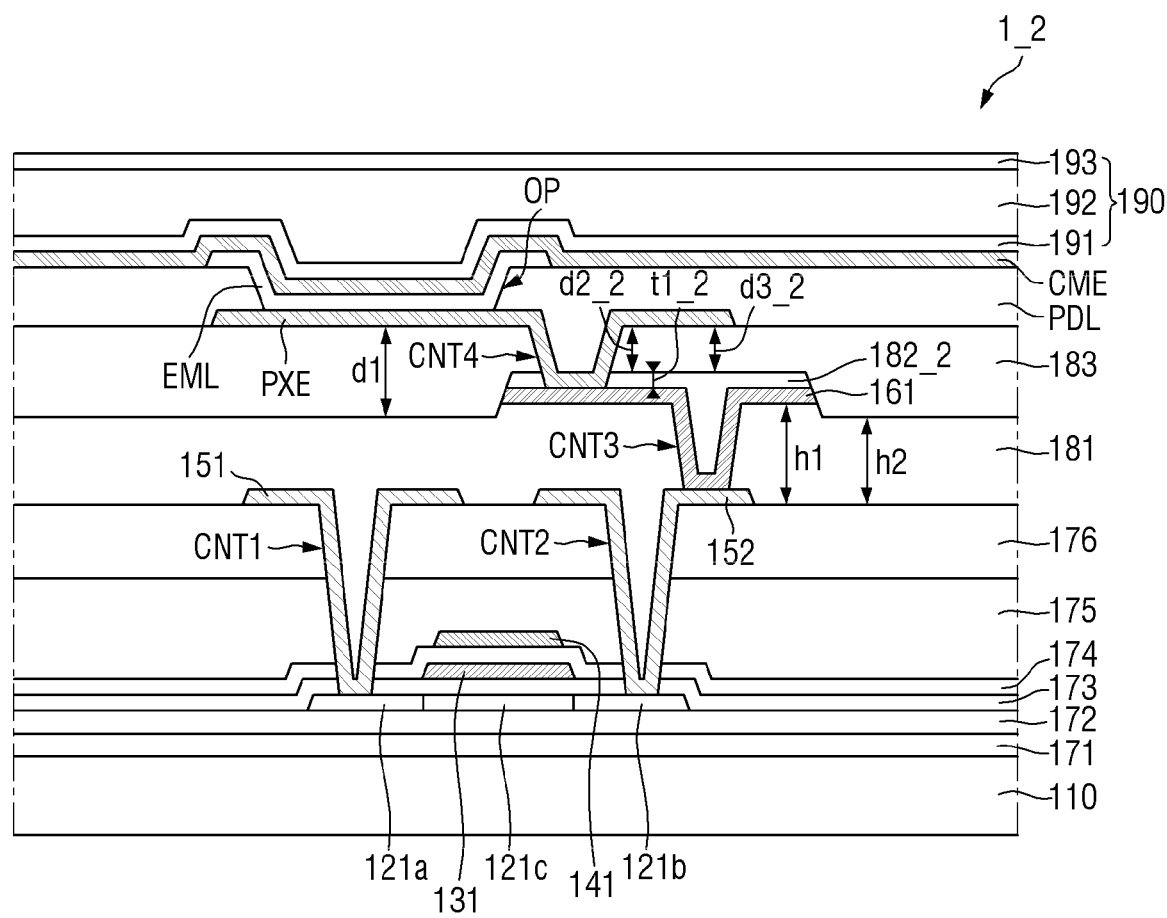
FIG. 13 is a cross-sectional view illustrating one pixel of a display device according to an embodiment.

FIG. 13 is a cross-sectional view illustrating one pixel of a display device 1_2 according to an embodiment.

Referring to FIG. 13, the display device 1_2 according to the present embodiment is different from the display device 1 according to one embodiment in that it includes the fourth contact hole CNT4 and a second via layer 182_2 having a top surface positioned higher than the top surface of the connection electrode 161. That is, in the present embodiment, the second via layer 182_2 may not only fill the third contact hole CNT3, but may also cover the top surface of the connection electrode 161.

The second via layer 182_2 may be disposed on the connection electrode 161. The side surface of the second via layer 182_2 may be aligned with the side surface of the connection electrode 161. The second via layer 182_2 may include the fourth contact hole CNT4 together with the third via layer 183. The pixel electrode PXE may be connected to the connection electrode 161 through the fourth contact hole CNT4 penetrating the third via layer 183 and the second via layer 182_2. The second via layer 182_2 may cover a region of the connection electrode 161 that does not overlap the fourth contact hole CNT4. The top surface of the second via layer 182_2 may be substantially flat. A thickness t1_2 of the second via layer 182_2 that does not overlap the third contact hole CNT3 may be substantially uniform for each region.

The top surface of the second via layer 182_2 may be positioned higher than the top surface of the first via layer 181. Specifically, the top surface of the second via layer 182_2 may be positioned higher than the top surface of the first via layer 181 that overlaps the connection electrode 161, and the top surface of the first via layer 181 that does not overlap the connection electrode 161.

In the third via layer 183, the thickness d1 of a region that does not overlap the second via layer 182_2 may be greater than thicknesses d2_2 and d3_2 of a region that overlaps the second via layer 182_2. In the region of the third via layer 183 that overlaps the second via layer 182_2, the thickness d3_2 of a region that overlaps the third contact hole CNT3 may be substantially the same as the thickness d2_2 of a region that does not overlap the third contact hole CNT3.

The display device 1_2 according to the present embodiment may include the second via layer 182_2 to improve the reliability of the display device 1. The second via layer 182_2 is a result of a process, and may be formed by etching back the second via insulator 182c (see FIG. 7) formed through etching of the masking pattern 182b (see FIG. 6) serving as a mask when patterning the connection electrode 161. When patterning the connection electrode 161 through the masking pattern 182b (see FIG. 6) which is in the form before being etched into the second via layer 182_2, the connection electrode 161 may be patterned without a separate stripping process, so that damage occurring in the first via layer 181, such as expansion of the first via layer 181, may be minimized, thus improving the reliability of the display device 1.

FIGS. 14 to 18 are cross-sectional views illustrating a part of a process for manufacturing the display device of FIG. 13. The manufacturing process of the display device according to the present embodiment is substantially the same as the manufacturing process of the display device described above with reference to FIGS. 3 to 9, but has a difference in that a process with reference to FIGS. 14 to 18 is performed instead of the process with reference to FIGS. 5 to 9. That is, FIGS. 14 to 18 are views showing a manufacturing process after passing through the processes of FIGS. 3 and 4.

Figure 14:
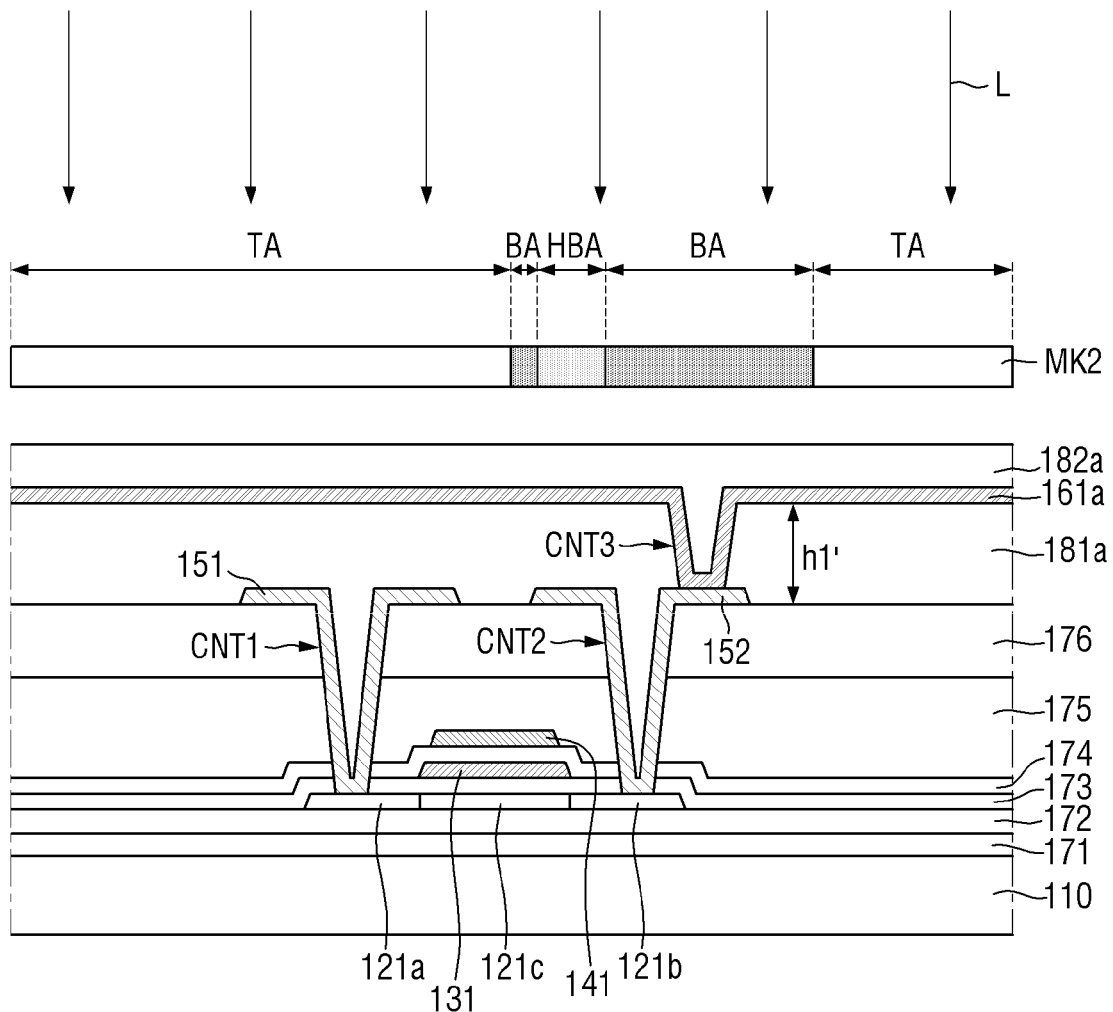
FIGS. 14, 15, 16, 17, and 18 are cross-sectional views illustrating a part of a process for manufacturing the display device of FIG. 13.
Figure 15:
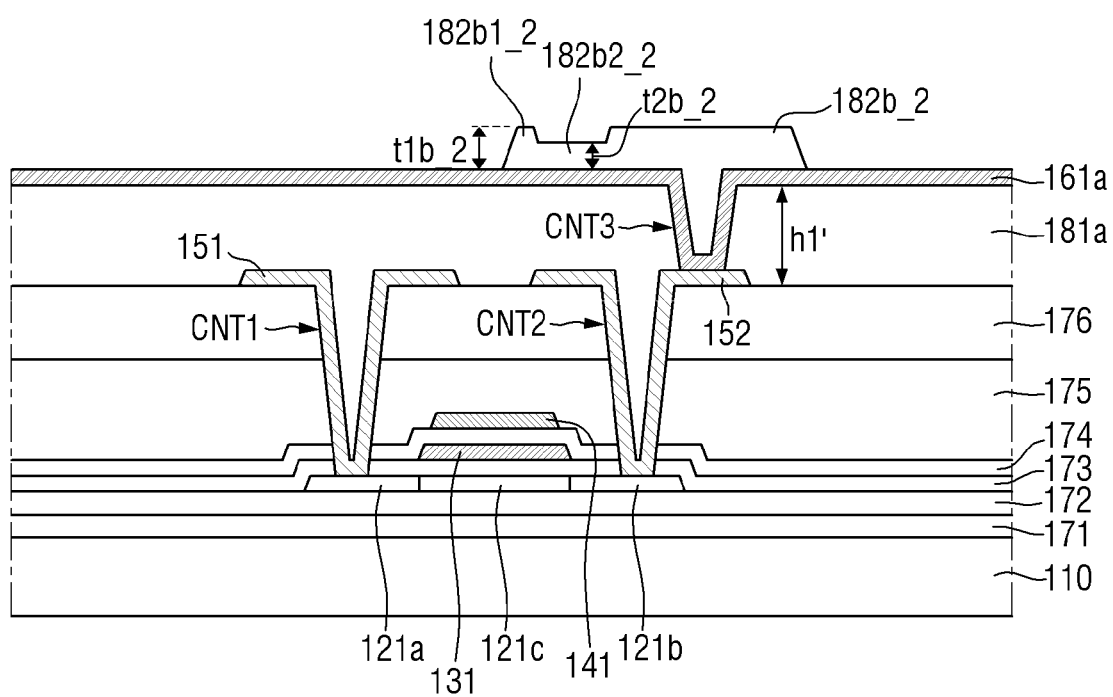
Figure 16:
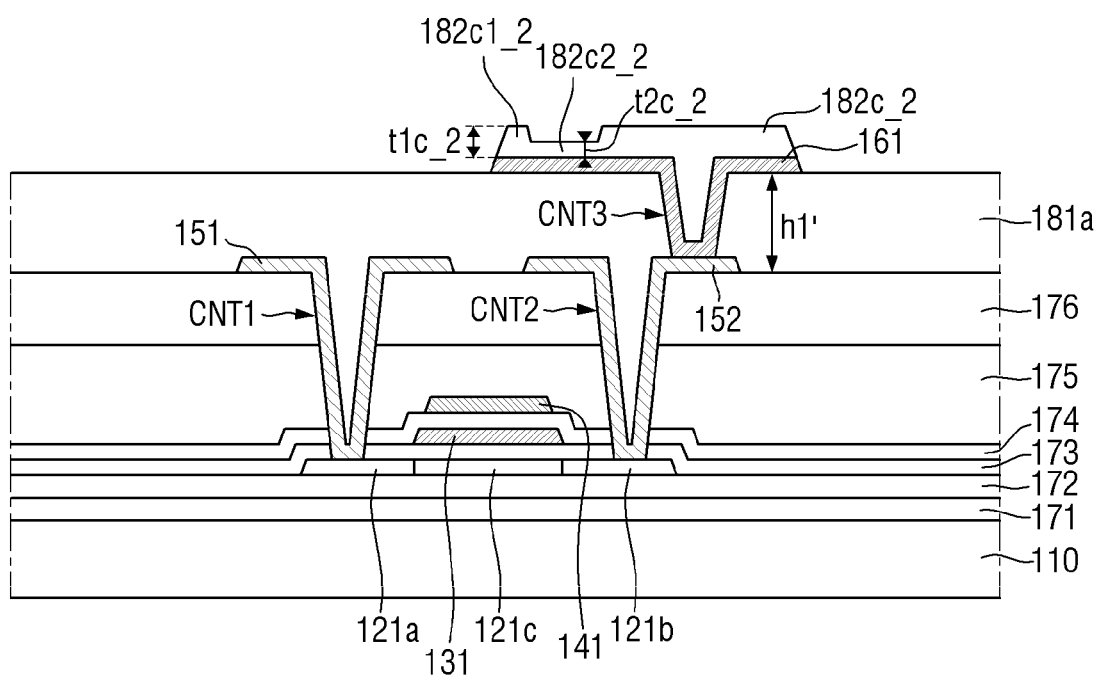

Referring to FIGS. 3 and 4 in conjunction with FIGS. 14 and 15, a second mask MK2 including the light transmitting area TA, the light blocking area BA, and a half-light blocking area HBA is provided above the second via insulator layer 182a, and then exposed and developed to form a masking pattern 182b_2. The second mask MK2 is a halftone mask, and by using the mask, the masking pattern 182b_2 having a different thickness for each region may be formed. Through this process, in the second via insulator layer 182a, a region overlapping the light transmitting area TA of the second mask MK2 is removed, a region overlapping the light blocking area BA remains, and a region overlapping the half-light blocking area HBA partially remains to complete the masking pattern 182b_2 covering the region where the connection electrode 161 is disposed.

The masking pattern 182b_2 may include a first masking pattern part 182b1_2 to which light L is not irradiated by overlapping the light blocking area BA of the second mask MK2, and a second masking pattern part 182b2_2 to which a part of the light L is irradiated by overlapping the half-light blocking area HBA of the second mask MK2. The second masking pattern part 182b2_2 may be disposed to be surrounded by the first masking pattern part 182b1_2. A thickness t1b_2 of the first masking pattern part 182b1_2 may be greater than a thickness t2b_2 of the second masking pattern part 182b2_2. Accordingly, a step is formed between the top surface of the first masking pattern part 182b1_2 and the top surface of the second masking pattern part 182b2_2, and the top surface of the second masking pattern part 182b2_2 may have a shape that is depressed compared to the top surface of the first masking pattern part 182b1_2. The light blocking area BA and the half-light blocking area HBA of the second mask MK2 may be disposed to overlap the third contact hole CNT3 so that the masking pattern 182b_2 is formed on the third contact hole CNT3 during exposure.

Referring to FIGS. 14 and 15 together, the connection electrode 161 is formed by etching the fourth conductive material 161a using the masking pattern 182b_2 as an etching mask.

Meanwhile, in the etching process for forming the connection electrode 161, the thickness of the masking pattern 182b_2 may also be partially reduced. As a result, referring now to FIGS. 15 and 16 together, the second via insulator 182c_2 may be formed. The second via insulator 182c_2 may be formed by partially etching the top surface of the masking pattern 182b_2. The second via insulator 182c_2 may completely cover the top surface of the connection electrode 161, but may not cover the side surface of the connection electrode 161.

The second via insulator 182c_2 may include a first via pattern part 182c1_2 formed by partially etching the first masking pattern part 182b1_2, and a second via pattern part 182c2_2 formed by partially etching the second masking pattern part 182b2_2.

The second via pattern part 182c2_2 may be disposed to be surrounded by the first via pattern part 182c1_2. A thickness t1c_2 of the first via pattern part 182c1_2 may be greater than a thickness t2c_2 of the second via pattern part 182c2_2. Accordingly, a step is formed between the top surface of the first via pattern part 182c1_2 and the top surface of the second via pattern part 182c2_2, and the top surface of the second via pattern part 182c2_2 may have a shape that is depressed compared to the top surface of the first via pattern part 182c1_2.

When the connection electrode 161 is patterned using the masking pattern 182b_2, a strip process using a separate chemical substance may not be performed. However, the top surface of the connection electrode 161 may be partially exposed by performing the etch-back process.

Figure 17:
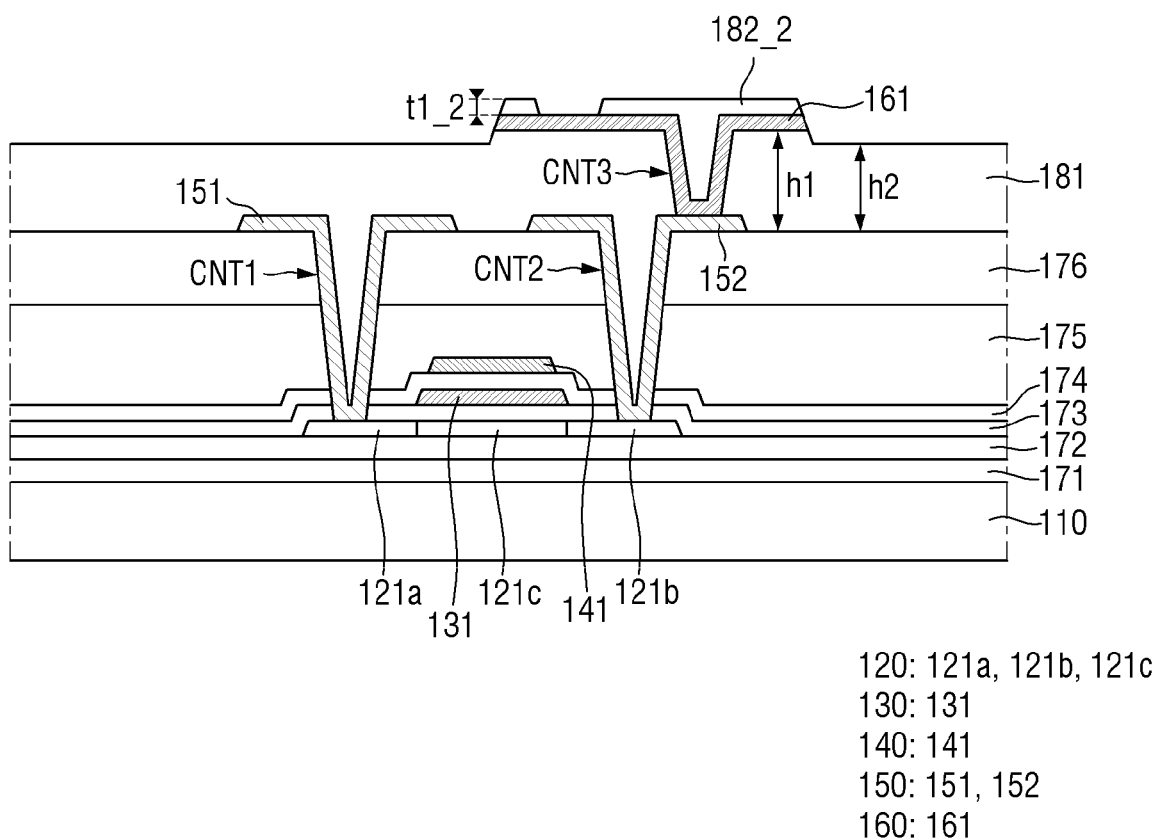

Thereafter, as shown in FIG. 17, the etch-back process is performed to remove the second via insulator 182c_2 on the top surface of the connection electrode 161, and partially expose the top surface of the connection electrode 161. Specifically, the second via pattern part 182c2_2 may be removed, and the first via pattern part 182c1_2 may be partially etched to form the second via layer 182_2. That is, the second via insulator 182c_2 may be etched back to partially expose the top surface of the connection electrode 161.

The etch-back process is performed using an etchant having a high etching rate for the second via insulator 182c_2. The etchant used in the etch-back process may include, for example, carbon tetrafluoride and oxygen.

The second via layer 182_2 may fill the inside of the third contact hole CNT3. As described above, the top surface of the second via layer 182_2 may be positioned higher than the top surface of the connection electrode 161 disposed in a region that does not overlap the third contact hole CNT3. The top surface of the second via layer 182_2 may be positioned higher than the top surface of the first via layer 181.

The second via layer 182_2 inside the third contact hole CNT3 derived from the masking pattern 182b_2 may remain without being removed even after the etch-back process. As described above, since the second via layer 182_2 includes any one of polyimide, methacrylate polymer, or siloxane polymer having high heat resistance, even if the second via layer 182_2 remains in the structure, a phenomenon in which the second via layer 182_2 is deformed by heat to affect the display device 1_2 may not occur. Accordingly, a process of stripping the mask pattern may be omitted. A stripper, which is usually used in the process of stripping the mask pattern, may cause damage such as swelling the first via layer 181, and as described above, if the stripping process for the second via layer 182_2 applied to the mask pattern is omitted, the above damage may be fundamentally prevented.

Meanwhile, although the etch-back process is a process for etching the second via insulator 182c_2, since the first via insulator 181a is also made of the same or similar material as the second via insulator 182c_2, the first via insulator 181a having the same or similar etching selectivity may be etched together through the etch-back process, so that the thickness of the first via insulator 181a may be reduced. Accordingly, the first via layer 181 having a stepped top surface may be completed.

Figure 18:
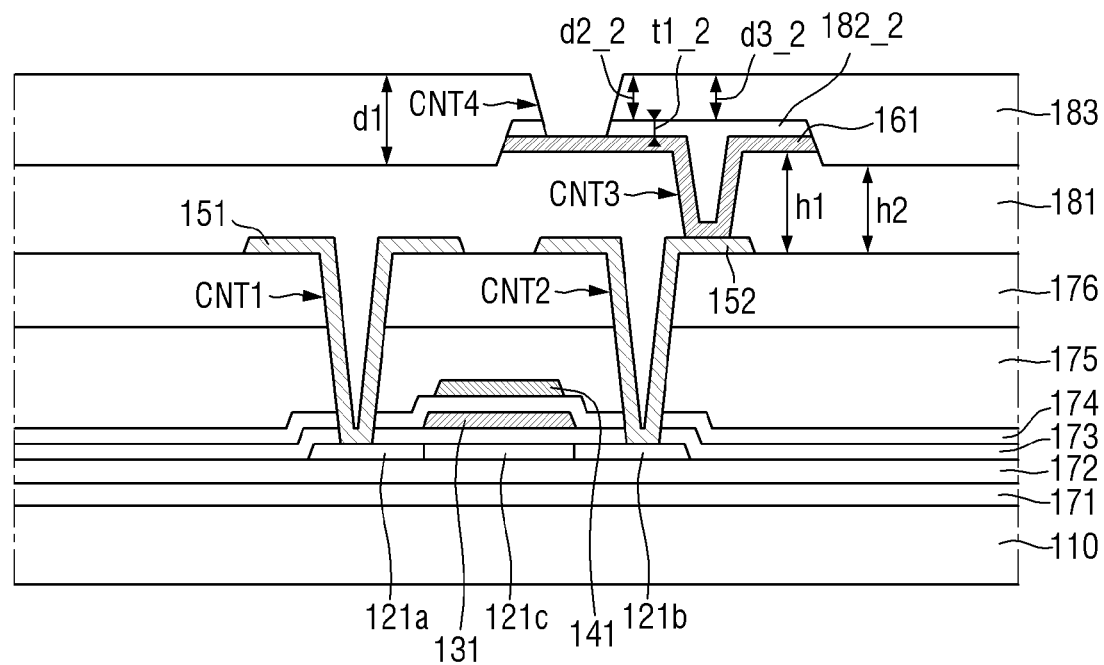

Next, referring to FIG. 18, the third via layer 183 is formed on the first via layer 181, the second via layer 182_2, and the connection electrode 161. Specifically, a material for the third via layer 183 is entirely coated on the structure of FIG. 17 and then exposed and developed to complete the third via layer 183 including the fourth contact hole CNT4.

Subsequently, although not shown, a material for the pixel electrode PXE is deposited on the third via layer 183 and patterned to form the pixel electrode PXE. The pixel electrode PXE may be disposed to contact the connection electrode 161 through the fourth contact hole CNT4.

Although not shown, the light emitting layer EML, the common electrode CME, and the thin film encapsulation layer 190 are formed in a subsequent process, so that the display device 1_2 according to one embodiment described above with reference to FIG. 13 may be manufactured.

Figure 19:
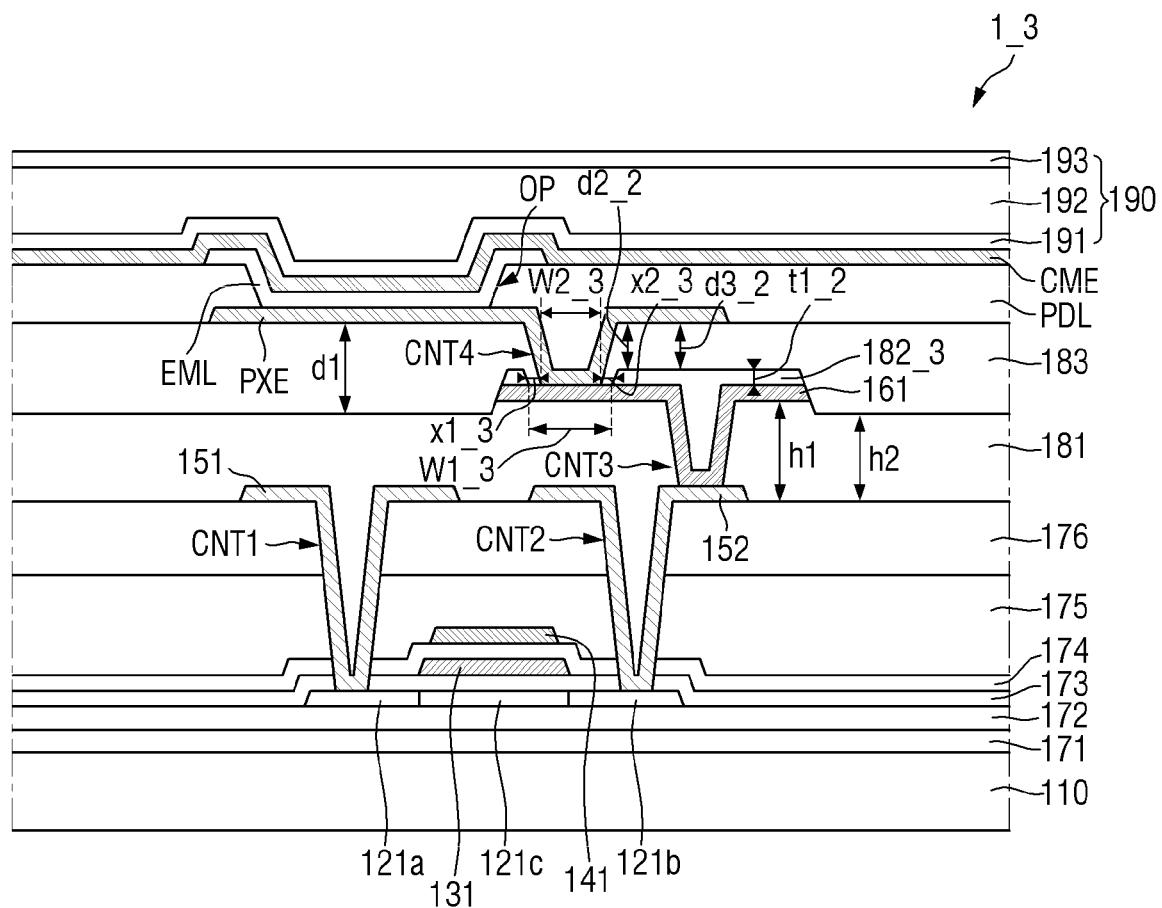
FIG. 19 is a cross-sectional view illustrating one pixel of a display device according to an embodiment.

FIG. 19 is a cross-sectional view illustrating one pixel of a display device 1_3 according to an embodiment.

Referring to FIG. 19, the display device 1_3 according to the present embodiment is different from the display device 1_2 according to the embodiment described with reference to FIG. 13 in that an opening included in a second via layer 182_3 has a larger width than an opening included in the third via layer 183.

The second via layer 182_3 may have an opening having a first width W1_3. An edge of the third via layer 183 constituting the fourth contact hole CNT4 and having a second width W2_3 smaller than the first width W1_3 may be disposed inside the opening of the second via layer 182_3.

The edge of the third via layer 183 constituting the opening may be disposed inside the edge of the second via layer 182_3 constituting the opening. One edge of the second via layer 182_3 and one edge of the third via layer 183 may be disposed to be spaced apart from each other by a first distance x1_3. The other edge of the second via layer 182_3 and the other edge of the third via layer 183 may be disposed to be spaced apart from each other by a second distance x2_3. The sum of the first distance x1_3 and the second distance x2_3 may be the same as the difference between the first width W1_3 and the second width W2_3.

The second via layer 182_3 and the pixel electrode PXE may be disposed separately from each other with the third via layer 183 interposed between the second via layer 182_3 and the pixel electrode PXE. The width of a region in which the pixel electrode PXE contacts the connection electrode 161 may be substantially the same as the second width W2_3, which is the width of the opening included in the third via layer 183. That is, the contact area between the pixel electrode PXE and the connection electrode 161 may be determined by the width of the opening of the third via layer 183.

The display device 1_3 according to the present embodiment may include the second via layer 182_3 to improve the reliability of the display device 1_3. The second via layer 182_3 is a result of a process, and may be formed by etching back the second via insulator 182c (see FIG. 7) formed through etching of the masking pattern 182b (see FIG. 6) serving as a mask when patterning the connection electrode 161. When patterning the connection electrode 161 through the masking pattern 182b (see FIG. 6) which is in the form before being etched into the second via layer 182_3, the connection electrode 161 may be patterned without a separate stripping process, so that damage occurring in the first via layer 181, such as expansion of the first via layer 181, may be minimized, thus improving the reliability of the display device 1.

In addition, in the display device 1_3 according to the present embodiment, the edge of the third via layer 183 constituting the opening is disposed inside the edge of the second via layer 182_3 constituting the opening. Therefore, the width of a region in which the pixel electrode PXE and the connection electrode 161 contact each other may be controlled by adjusting the size of the opening included in the third via layer 183.

Figure 20:
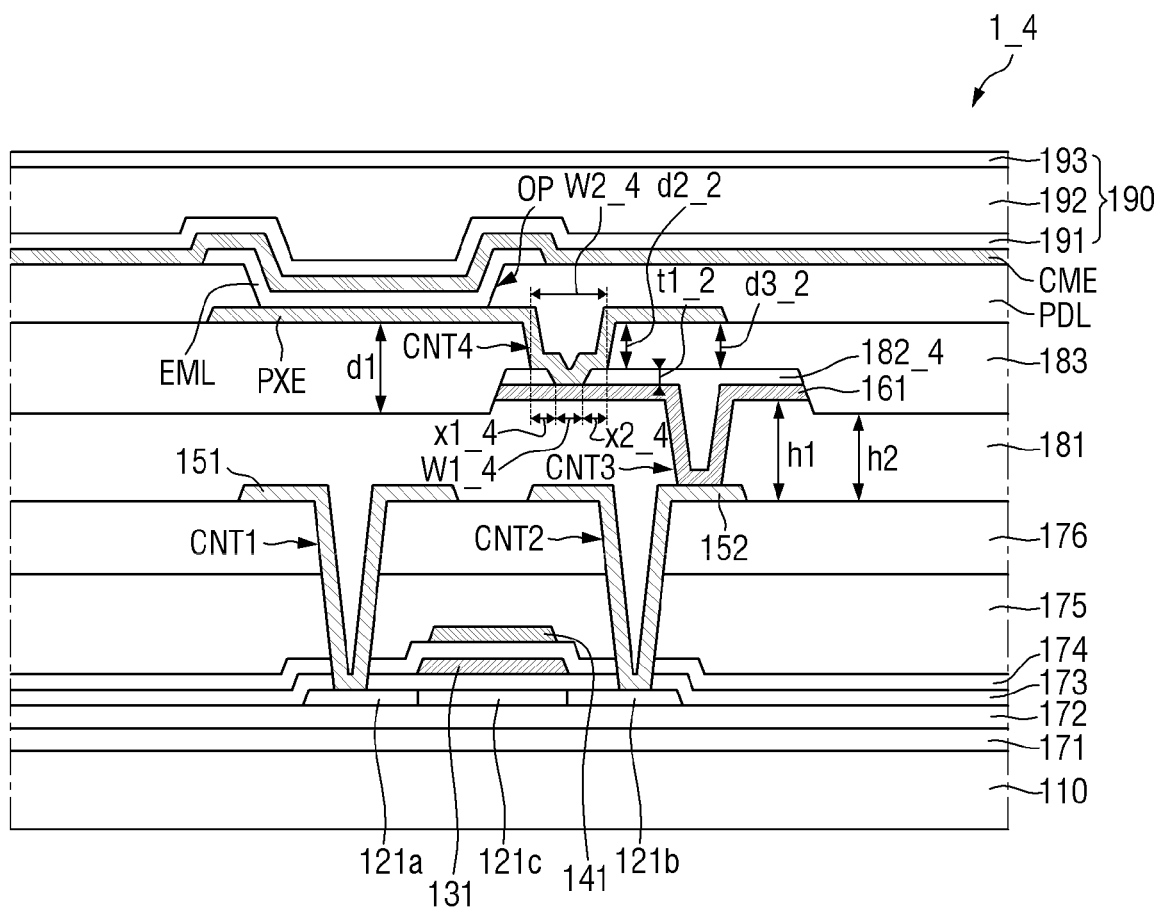
FIG. 20 is a cross-sectional view illustrating one pixel of a display device according to an embodiment.

FIG. 20 is a cross-sectional view illustrating one pixel of a display device according to an embodiment.

Referring to FIG. 20, a display device 1_4 according to the present embodiment is different from the display device 1_2 according to the embodiment described with reference to FIG. 13 in that an opening included in a second via layer 182_4 has a smaller width than an opening included in the third via layer 183.

The second via layer 182_4 may have an opening having a first width W1_4.

Inside the opening of the second via layer 182_4, an edge of the third via layer 183 constituting the fourth contact hole CNT4 and having a second width W2_4 greater than the first width W1_4 may be disposed.

The edge of the third via layer 183 constituting the opening may be disposed outside the edge of the second via layer 182_4 constituting the opening. One edge of the second via layer 182_4 and one edge of the third via layer 183 may be disposed to be spaced apart from each other by a first distance x1_4. The other edge of the second via layer 182_4 and the other edge of the third via layer 183 may be disposed to be spaced apart from each other by a second distance x2_4. The sum of the first distance x1_4 and the second distance x2_4 may be the same as the difference between the second width W2_4 and the first width W1_4.

The width of a region in which the pixel electrode PXE contacts the connection electrode 161 may be substantially the same as the first width W1_4, which is the width of the opening included in the second via layer 182_4. That is, the contact area between the pixel electrode PXE and the connection electrode 161 may be determined by the width of the opening of the second via layer 182_4.

The pixel electrode PXE may be disposed on the second via layer 182_4. The pixel electrode PXE may directly contact the second via layer 182_4.

The display device 1_4 according to the present embodiment may include the second via layer 182_4 to improve the reliability of the display device 1_4. The second via layer 182_4 is a result of a process, and may be formed by etching back the second via insulator 182c (see FIG. 7) formed through etching of the masking pattern 182b (see FIG. 6)

serving as a mask when patterning the connection electrode 161. When patterning the connection electrode 161 through the masking pattern 182*b* (see FIG. 6) which is in the form before being etched into the second via layer 182_4, the connection electrode 161 may be patterned without a separate stripping process, so that damage occurring in the first via layer 181, such as expansion of the first via layer 181, may be minimized, thus improving the reliability of the display device 1.

In addition, in the display device 1_4 according to the present embodiment, the edge of the third via layer 183 constituting the opening is disposed outside the edge of the second via layer 182_4 constituting the opening. Therefore, the width of a region in which the pixel electrode PXE and the connection electrode 161 contact each other may be controlled by adjusting the size of the opening included in the second via layer 182_4.

In concluding the detailed description, those skilled in the art will appreciate that many variations and modifications can be made to the embodiments without substantially departing from the principles of the inventive concept. Therefore, the disclosed embodiments are used in a generic and descriptive sense only and not for purposes of limitation.

What is claimed is:

1. A display device comprising:
   a substrate;
   a first conductive layer disposed on the substrate;
   a first insulating layer disposed on the first conductive layer;
   a second conductive layer connected to the first conductive layer through a first contact hole in the first insulating layer;
   a second insulating layer filling an inside of the first contact hole; and
   a third insulating layer disposed on and directly contacting the second conductive layer and the second insulating layer,
   wherein the first insulating layer includes a first region that overlaps the second conductive layer and a second region that does not overlap the second conductive layer,
   a top surface of the first region of the first insulating layer is positioned higher than a top surface of the second region of the first insulating layer, and
   the second insulating layer does not directly contact the first insulating layer.

2. The display device of claim 1, wherein a thickness of the first region of the first insulating layer is greater than a thickness of the second region of the first insulating layer.

3. The display device of claim 1, wherein an average roughness of the top surface of the first region of the first insulating layer is smaller than an average roughness of the top surface of the second region of the first insulating layer.

4. The display device of claim 3, wherein the average roughness of the top surface of the first region of the first insulating layer is the same as an average roughness of a top surface of the second insulating layer.

5. The display device of claim 1, wherein a top surface of the first insulating layer includes a step formed between the first region and the second region.

6. The display device of claim 1, wherein a top surface of the second insulating layer is positioned higher than the top surface of the first region of the first insulating layer.

7. The display device of claim 1, wherein the third insulating layer includes a third region that overlaps the second conductive layer and a fourth region that does not overlap the second conductive layer, and
   a thickness of the fourth region of the third insulating layer is greater than a thickness of the third region of the third insulating layer.

8. The display device of claim 7, wherein a top surface of the fourth region of the third insulating layer is flat.

9. The display device of claim 1, wherein a top surface of the second insulating layer is aligned with a top surface of the second conductive layer disposed outside the first contact hole.

10. The display device of claim 1, wherein the second insulating layer partially covers a top surface of the second conductive layer.

11. The display device of claim 10, further comprising a third conductive layer disposed on the third insulating layer,
    wherein the third conductive layer is connected to the second conductive layer through a second contact hole penetrating the second insulating layer and the third insulating layer.

12. The display device of claim 1, wherein the second insulating layer includes at least one of polyimide, methacrylate polymer and siloxane polymer.

13. The display device of claim 12, wherein at least one of the first insulating layer and the third insulating layer is made of the same material as the second insulating layer.

* * * * *